US010354734B2

(12) United States Patent
Saito et al.

(10) Patent No.: US 10,354,734 B2
(45) Date of Patent: Jul. 16, 2019

(54) MEMORY DEVICE INCLUDING MULTIPLE GATE-INDUCED DRAIN LEAKAGE CURRENT GENERATOR CIRCUITS

(71) Applicant: Micron Technology, Inc., Boise, ID (US)

(72) Inventors: Masanobu Saito, Inageku (JP); Shuji Tanaka, Kamakura (JP); Shinji Sato, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/911,910

(22) Filed: Mar. 5, 2018

(65) Prior Publication Data

US 2018/0211710 A1    Jul. 26, 2018

Related U.S. Application Data

(63) Continuation of application No. 15/416,870, filed on Jan. 26, 2017, now Pat. No. 9,916,901.

(51) Int. Cl.
    *G11C 16/06*    (2006.01)
    *G11C 16/14*    (2006.01)
    (Continued)

(52) U.S. Cl.
    CPC .......... *G11C 16/14* (2013.01); *G11C 16/0483* (2013.01); *G11C 16/16* (2013.01);
    (Continued)

(58) Field of Classification Search
    CPC ..... G11C 16/10; G11C 16/26; G11C 16/0483; G11C 13/0002; G11C 13/0026;
    (Continued)

(56) References Cited

U.S. PATENT DOCUMENTS

| 7,995,391 B2 | 8/2011 | Aritome |
| 9,449,694 B2 | 9/2016 | Paudel et al. |

(Continued)

FOREIGN PATENT DOCUMENTS

| CN | 109104879 A | 12/2018 |
| TW | 201842507 A | 12/2018 |
| WO | WO-2018140084 A1 | 8/2018 |

OTHER PUBLICATIONS

"International Application Serial No. PCT/US2017/046561, International Search Report dated Nov. 21, 2017", 3 pgs.

(Continued)

*Primary Examiner* — Thong Q Le
(74) *Attorney, Agent, or Firm* — Schwegman Lundberg & Woessner, P.A.

(57) ABSTRACT

Some embodiments include apparatuses and methods of using and forming such apparatuses. An apparatus among the apparatuses includes first and second conductive materials located in respective first and second levels of the apparatus, a pillar including a length extending between the first and second conductive materials, memory cells and control lines located along the pillar, a first select gate and a first select line located along the pillar between the first conductive material and the memory cells, a second select gate and a second select line located along the pillar between the first conductive material and the first select line, a first transistor and a first transistor gate line located along the pillar between the first conductive material and the first select line, and a second transistor and a second transistor gate line located along the pillar between the first conductive material and the first transistor.

20 Claims, 21 Drawing Sheets

(51) Int. Cl.
*G11C 16/26* (2006.01)
*H01L 27/11582* (2017.01)
*H01L 23/522* (2006.01)
*H01L 23/528* (2006.01)
*G11C 16/04* (2006.01)
*G11C 16/16* (2006.01)
*H01L 27/11524* (2017.01)
*H01L 27/11556* (2017.01)
*H01L 27/1157* (2017.01)
*G11C 16/10* (2006.01)
*G11C 16/30* (2006.01)

(52) U.S. Cl.
CPC ............ *G11C 16/26* (2013.01); *H01L 23/528* (2013.01); *H01L 23/5226* (2013.01); *H01L 27/1157* (2013.01); *H01L 27/11524* (2013.01); *H01L 27/11556* (2013.01); *H01L 27/11582* (2013.01); *G11C 16/10* (2013.01); *G11C 16/30* (2013.01)

(58) Field of Classification Search
CPC . G11C 13/0028; G11C 2213/71; G11C 16/08; G11C 16/16; G11C 5/025; G11C 16/30; G11C 11/34; G11C 16/0458; G11C 16/14; G11C 5/147; G11C 7/00; G11C 11/5628

USPC .......................... 365/51, 130, 174, 180, 135
See application file for complete search history.

(56) References Cited

U.S. PATENT DOCUMENTS

| | | |
|---|---|---|
| 9,916,901 B1 | 3/2018 | Saito et al. |
| 2012/0069667 A1 | 3/2012 | Shirakawa |
| 2014/0077285 A1 | 3/2014 | Noda et al. |
| 2014/0374688 A1 | 12/2014 | Wu et al. |
| 2015/0357344 A1 | 12/2015 | Tanzawa |
| 2016/0020389 A1 | 1/2016 | Ratnam et al. |
| 2016/0071593 A1 | 3/2016 | Hashimoto |
| 2018/0090208 A1* | 3/2018 | Sakui ................. G11C 16/08 |

OTHER PUBLICATIONS

"International Application Serial No. PCT/US2017/046561, Written Opinion dated Nov. 21, 2017", 6 pgs.
"Taiwanese Application Serial No. 106128515, Translation Filed Oct. 26, 2017", w/English Claims, 224 pgs.
"Taiwanese Application Serial No. 106128515, Office Action dated Oct. 4, 2018", W/ English Translation, 34 pgs.
"Taiwanese Application Serial No. 106128515, Response filed Dec. 28, 2018to Office Action dated Oct. 4, 2018", w/ English Claims, 62 pgs.

* cited by examiner

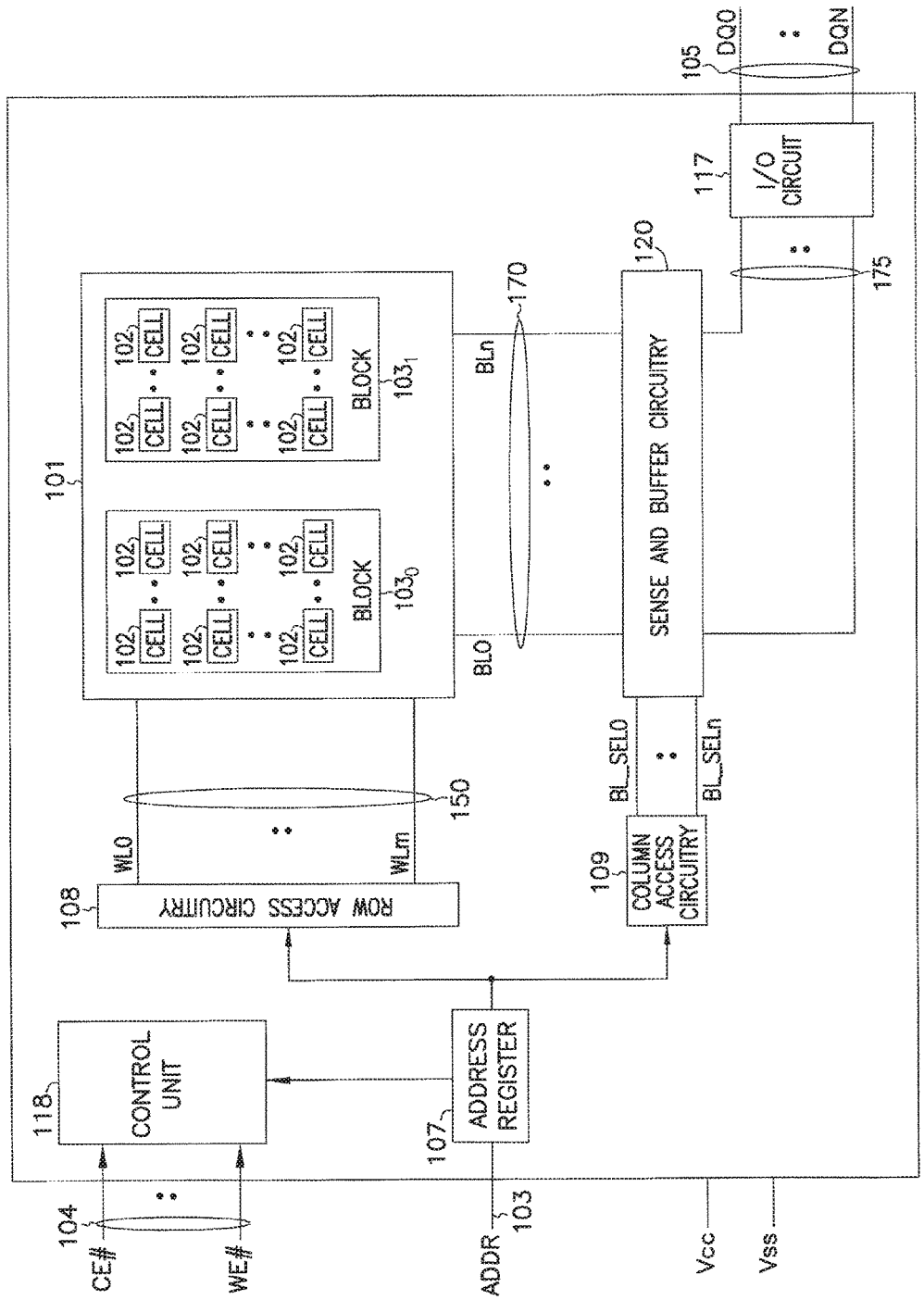

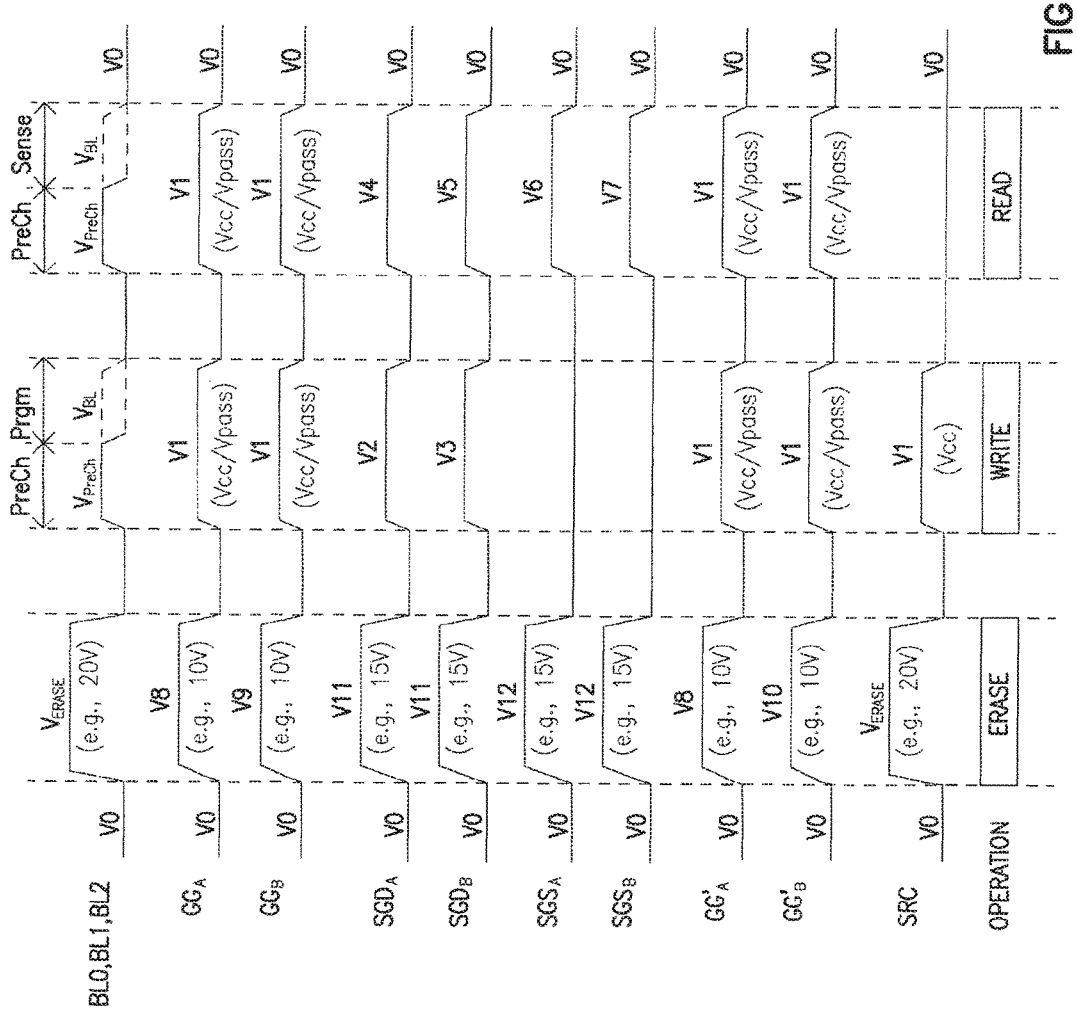

MEMORY DEVICE INCLUDING MULTIPLE GATE-INDUCED DRAIN LEAKAGE CURRENT GENERATOR CIRCUITS

PRIORITY APPLICATION

This application is a continuation of U.S. application Ser. No. 15/416,870, filed Jan. 26, 2017, which is incorporated herein by reference in its entirety.

BACKGROUND

Memory devices are widely used in computers and many electronic items to store information. A memory device usually has numerous memory cells. The memory device performs a write operation to store information in the memory cells, a read operation to retrieve the stored information, and an erase operation to clear information (e.g., obsolete information) from some or all of the memory cells. The reliability of these operations highly depends on the structure of the memory device and the techniques used to operate it. Some conventional memory devices have structures and operations that are reliable for some applications but unsuitable for other applications.

BRIEF DESCRIPTION OF THE DRAWINGS

FIG. 1 shows a block diagram of an apparatus in the form of a memory device, according to some embodiments described herein.

FIG. 8D shows example waveforms of some of the signals of the memory device of FIG. 8A through FIG. 8C during example erase, write, and read operations, according to some embodiments described herein.

DETAILED DESCRIPTION

Figure 2A:
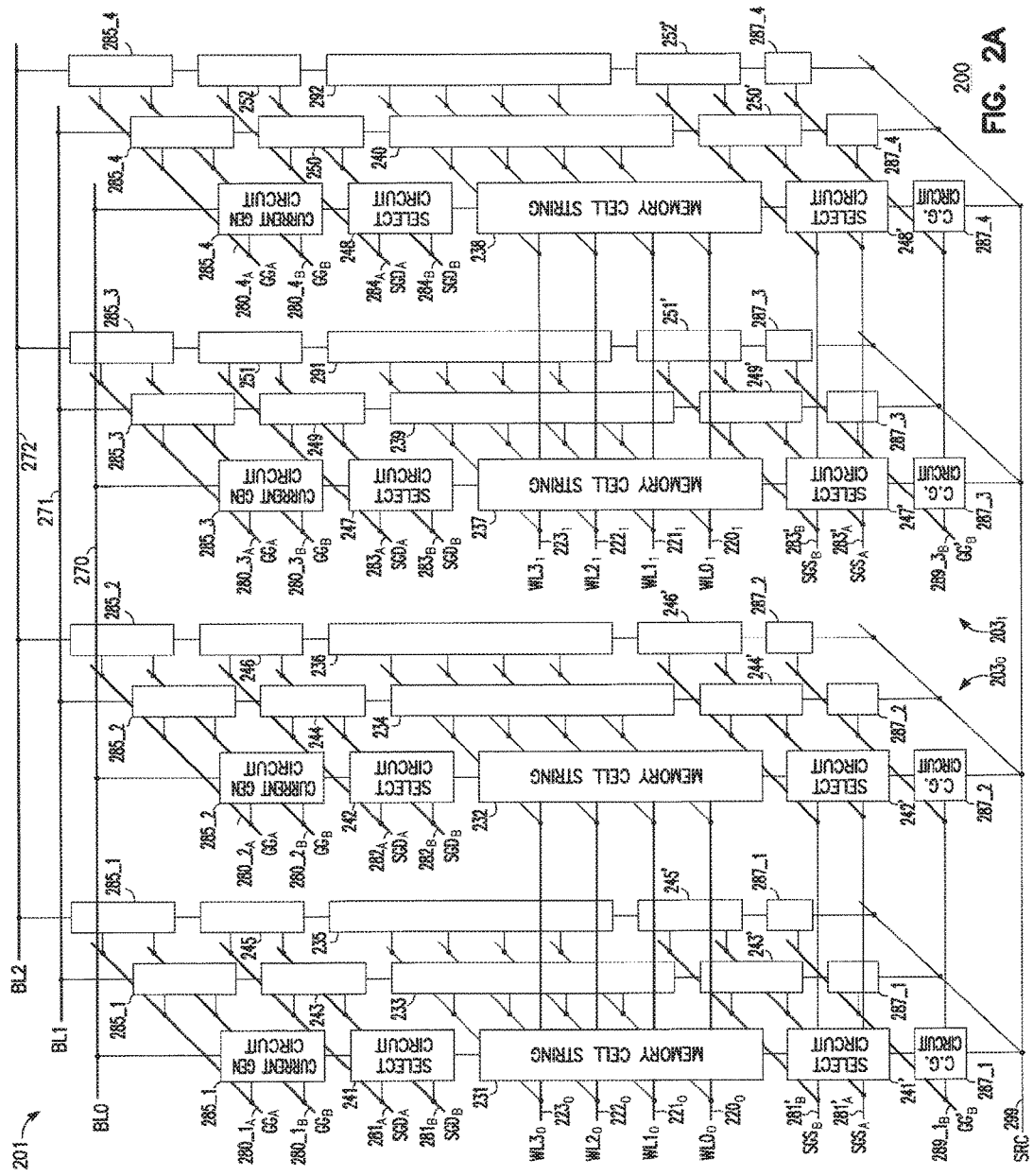
FIG. 2A shows a block diagram of a portion of a memory device including a memory array having top and bottom gate-induced drain leakage (GIDL) current generator circuits, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (memory cell blocks), such as blocks $103_0$ and $103_1$. In the physical structure of memory device 100, memory cells 102 can be arranged vertically (e.g., stacked over each other) over a substrate (e.g., a semiconductor substrate) of memory device 100. FIG. 1 shows memory device 100 having two blocks $103_0$ and $103_1$ as an example. Memory device 100 can have more than two blocks (e.g., up to thousands or more blocks).

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks $103_0$ and $103_1$ and data lines 170 to selectively exchange information (e.g., data) with memory cells 102 of blocks $103_0$ and $103_1$.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which of blocks $103_0$ and $103_1$ are to be accessed during a memory operation. Memory device 100 can perform a read operation to read (e.g., sense) information (e.g., previously stored information) in memory cells 102 of blocks $103_0$ and $103_1$, or a write (e.g., programming) operation to store (e.g., program) information in memory cells 102 of blocks $103_0$ and $103_1$. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks $103_0$ and $103_1$.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks $103_0$ and $103_1$ and provide the value of the information to lines (e.g., global data lines) 175. Sense and buffer circuitry 120 can also can be configured to use signals on lines 175 to determine the value of information to be stored (e.g., programmed) in memory cells 102 of blocks $103_0$ and $103_1$ (e.g., during a write operation) based on the values (e.g., voltage values) of signals on lines 175 (e.g., during a write operation).

Memory device 100 can include input/output (I/O) circuitry 117 to exchange information between memory cells 102 of blocks $103_0$ and $103_1$ and lines (e.g., I/O lines) 105. Signals DQ0 through DQN on lines 105 can represent information read from or stored in memory cells 102 of blocks $103_0$ and $103_1$. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit) or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 12.

FIG. 2A shows a block diagram of a portion of a memory device 200 including a memory array 201 having circuits 285_1, 285_2, 285_3, 285_4, 287_1, 287_2, 287_3, 287_4, memory cell strings 231 through 240, 291, and 292, select circuits 241 through 252 and 241' through 252', according to some embodiments described herein. Memory device 200 can correspond to memory device 100 of FIG. 1. For example, memory array 201 can form part of memory array 101 of FIG. 1.

As described in more detailed with reference to FIG. 2B, FIG. 2C, and FIG. 2D, circuits 285_1, 285_2, 285_3, and 285_4 and circuits 287_1, 287_2, 287_3, 287_4 can be used to generate GIDL current to help improve an erase operation of memory device 200. Thus, circuits 285_1, 285_2, 285_3, and 285_4 can be called current generator circuits (e.g., top GILD current generator circuits) and circuits 287_1, 287_2, 287_3, 287_4 can also be called current generator circuits (e.g., bottom GIDL current generator circuits). In FIG. 2A, "C.G. Circuit" stands for "current generator circuit".

As shown in FIG. 2A, memory device 200 can include blocks (blocks of memory cells) $203_0$ and $203_1$. Two blocks are shown as an example. Memory device 200 can include many blocks (e.g., up to thousands or more blocks). Each of blocks $203_0$ and $203_1$ has its own memory cell strings and associated select circuits and GIDL current generator circuits. For example, block $203_0$ has memory cell strings 231 through 236, select circuits 241 through 246 and 241' through 246', circuits 285_1 and 285_2, and circuits 287_1 and 287_2. Block $203_1$ has memory cell strings 237 through 240, 291, and 292, select circuits 247 through 252 and 247' through 252', circuits 285_3 and 285_4, and circuits 287_3 and 287_4.

Each of memory cell strings 231 through 240, 291, and 292 has memory cells (shown in FIG. 2B) arranged in a string (e.g., coupled in series among each other) to store information. During an operation (e.g., write or read) of memory device 200, memory cell strings 231 through 240, 291, and 292 can be individually selected to access the memory cells in the selected memory cell string in order to store information in or retrieve information from the selected memory cell strings. Thus, in a write operation, the selected memory cell strings are memory cell strings (among memory cell strings 231 through 240, 291, and 292) selected to store information in selected memory cells of the selected memory cell strings. In a read operation, the selected memory cell strings are memory cell strings (among memory cell strings 231 through 240, 291, and 292) selected to read information from selected memory cells of the selected memory cell strings. During an erase operation, some or all of the memory cell strings in a particular block can be selected (e.g., concurrently selected) to erase information from them.

Each of the memory cell strings 231 through 240, 291, and 292, can be associated with (e.g., coupled to) two select circuits and two current generator circuits. For example, memory cell string 231 is associated with select circuit (e.g., top select circuit) 241, select circuit (e.g., bottom select circuit) 241', circuit 285_1 (directly above select circuit 241), and circuit 287_1 (directly below select circuit 241'). FIG. 2A shows an example of six memory cell strings and their associated circuits (e.g., top and bottom select circuits and top and bottom GIDL current generator circuits) in each of blocks $203_0$ and $203_1$. The number of memory cell strings and their associated select circuits and current generator circuits in each of blocks $203_0$ and $203_1$ can vary.

Memory device 200 can include lines 270, 271, and 272 that carry signals BL0, BL1, and BL2, respectively. Lines 270, 271, and 272 can correspond to data lines 170 of FIG. 1. In FIG. 2A, each of lines 270, 271, and 272 can be structured as a conductive line and can form part of a respective data line (e.g., bit line) of memory device 200. The memory cell strings of blocks $203_0$ and $203_1$ can share lines 270, 271, and 272. For example, memory cell strings 231, 232, 237, and 238 can share line 270. Memory cell strings 233, 234, 239, and 240 can share line 271. Memory cell strings 235, 236, 291, and 292 can share line 272. FIG. 2A shows three lines (e.g., data lines) 270, 271, and 272 as an example. The number of data lines can vary.

Memory device 200 can include a line 299 that can carry a signal SRC (e.g., source line signal). Line 299 can be structured as a conductive line and can form part of a source (e.g., a source line) of memory device 200. Blocks $203_0$ and $203_1$ can share line 299.

Memory device 200 can include separate control lines in blocks $203_0$ and $203_1$. As shown in FIG. 2A, memory device 200 can include control lines $220_0$, $221_0$, $222_0$, and $223_0$ that can carry corresponding signals (e.g., word line signals) $WL0_0$, $WL1_0$, $WL2_0$, and $WL3_0$. Memory device 200 can include control lines $220_1$, $221_1$, $222_1$, and $223_1$ that can carry corresponding signals (e.g., word line signals) $WL0_1$, $WL1_1$, $WL2_1$, and $WL3_1$. FIG. 2A shows four control lines ($220_0$ through $223_0$ or $220_1$ through $223_1$) in each of blocks $203_0$ and $203_1$ as an example. The number of control lines can vary.

Control lines $220_0$ through $223_0$ and $220_1$ through $223_1$ can form part of respective access lines (e.g., similar to access lines 150 of FIG. 1) of memory device 200 to access memory cells in a respective block. For example, during a read or write operation to store information in or retrieve information from a memory cell (or memory cells) in block $203_0$, control lines $220_0$, $221_0$, $222_0$, and $223_0$ can be activated (e.g., provided with positive voltages) to access a selected memory cell (or memory cells) in block $203_0$. In memory device 200, blocks $203_0$ and $203_1$ (which share lines 270, 271, and 272) can be accessed (e.g., accessed during a read or write operation) one block at a time. Thus, in the example here, control lines $220_1$, $221_1$, $222_1$, and $223_1$ of block $203_1$ can be deactivated (e.g., provided with zero volts (e.g., ground)) when control lines $220_0$, $221_0$, $222_0$, and $223_0$ of block $203_0$ are activated.

As shown in FIG. 2A, memory device 200 can include double (e.g., upper and lower) drain select lines, including select lines $281_A$, $282_A$, $283_A$, and $284_A$ (e.g., upper drain select lines) and select lines $281_B$, $282_B$, $283_B$, and $284_B$, (e.g., lower drain select lines). Each of select lines $281_A$, $282_A$, $283_A$, and $284_A$ can carry a separate (e.g., different) signal (e.g., an upper select line signal) $SGD_A$. Each of select lines $281_B$, $282_B$, $283_B$, and $284_B$ can carry a separate signal (e.g., a lower select line signal) $SGD_B$.

As shown in FIG. 2A, select circuits 241, 243, and 245 can share select lines $281_A$ and $281_B$. Select circuits 242, 244, and 246 can share select line $282_A$ and $282_B$. Select circuits 247, 249, and 251 can share select line $283_A$ and $283_B$. Select circuits 248, 250, and 252 can share select line $284_A$ and $284_B$. Each of select circuits 241 through 252 can include multiple select gates (e.g., multiple transistors, shown in FIG. 2B) that can be controlled (e.g., turned on or turned off) by two respective select lines (e.g., $281_A$ and $281_B$, $282_A$ and $282_B$, $283_A$ and $283_B$, or $284_A$ and $284_B$).

Memory device 200 can include double (e.g., lower and upper) source select lines, including select lines $281'_A$ and $283'_A$ (e.g., lower source select lines) and select lines $281'_B$ and $283'_B$ (e.g., upper source select lines). Each of select lines $281'_A$ and $283'_A$ can carry a separate (e.g., different) signal $SGS_A$. Each of select lines $281'_B$ and $283'_B$ can carry a separate (e.g., different) signal $SGS_B$. In an alternative arrangement of memory device 200, lines $281'_A$ and $283'_A$ can carry the same signal, and lines $281'_B$ and $283'_B$ can carry the same signal.

Select circuits 241' through 246' can share select lines $281'_A$ and $281'_B$. Select circuits 247' through 252' can share select lines $283'_A$ and $283'_B$. Each of select circuits 241' through 252' can include multiple select gates (e.g., multiple transistors, shown in FIG. 2B) that can be controlled (e.g., turned on or turned off) by two respective select lines (e.g., $281'_A$ and $281'_B$, or $283'_A$ and $283'_B$).

Each of circuits (e.g., top GIDL current generator circuits) 285_1, 285_2, 285_3, and 285_4 can be coupled in series with a respective select circuit (among select circuits 241 through 252) between a respective data line (one of lines 270, 271, and 272) and a respective memory string (among memory cell strings 231 through 240, 291, and 292). Each of circuits 285_1, 285_2, 285_3, and 285_4 can include multiple transistors (shown in FIG. 2B).

As shown in FIG. 2A, memory device 200 can include lines $280\_1_A$, $280\_2_A$, $280\_3_A$, and $280\_4_A$, each of which can carry a separate (e.g., different) signal $GG_A$. Memory device 200 also includes lines $280\_1_B$, $280\_2_B$, $280\_3_B$, and $280\_4_B$, each of which can carry a separate signal $GG_B$. Lines $280\_1_A$, $280\_2_A$, $280\_3_A$, $280\_4_A$, $280\_1_B$, $280\_2_B$, $280\_3_B$, and $280\_4_B$ can be coupled to the gates of respective transistors (shown in FIG. 2B) of circuits 285_1, 285_2, 285_3, and 285_4. Thus, lines $280\_1_A$, $280\_2_A$, $280\_3_A$, $280\_4_A$, $280\_1_B$, $280\_2_B$, $280\_3$, and $280\_4_B$ can be called transistor gate lines.

As shown in FIG. 2A, circuits 285_1 can share lines $280\_1_A$ and $280\_1_B$. Circuits 285_2 can share lines $280\_2_A$ and $280\_2_B$. Circuits 285_3 can share lines $280\_3_A$ and $280\_3_B$. Circuits 285_4 can share lines $280\_4_A$ and $280\_4_B$. Each of circuits 285_1, 285_2, 285_3, and 285_4 can be controlled (e.g., turned on or turned off) by two respective transistor gate lines (e.g., $280\_1_A$ and $280\_1_B$, $280\_2_A$ and $280\_2_3$, $280\_3_A$ and $280\_3_B$, or $280\_4_A$ and $280\_4_B$).

Each of circuits (e.g., bottom GIDL current generator circuits) 287_1, 287_2, 287_3, and 287_4 can be coupled in series with a respective select circuit (among select circuits 241' through 252') between line 299 and a respective memory string (among memory cell strings 231 through 240, 291, and 292). Each of circuits 287_1, 287_2, 287_3, and 287_4 can include a transistor (shown in FIG. 2B).

As shown in FIG. 2A, memory device 200 can include lines $289\_1_B$ and $289\_3_B$, each of which can carry a separate (e.g., different) signal $GG'_B$. Lines $289\_1_B$ and $289\_3_B$ can be coupled to the gates of respective transistors (shown in FIG. 2B) of circuits 287_1, 287_2, 287_3, and 287_4. Thus, lines $289\_1_B$ and $289\_3_B$ can be called transistor gate lines.

As shown in FIG. 2A, circuits 287_1 and 287_2 can share lines $289\_1_B$. Circuits 287_3 and 287_4 can share lines 289_3$_B$. Each of circuits 287_1, 287_2, 287_3, and 287_4 can be controlled (e.g., turned on or turned off) by a respective transistor gate line (e.g., 289_1$_B$ and 289_3$_B$).

During an operation (e.g., read or write operation) of memory device 200, signals GG$_A$ and GG$_B$ can be used to activate (e.g., turn on) respective circuits 285_1, 285_2, 285_3, and 285_4, and signal GG'$_B$ can be used to activate (e.g., turn on) respective circuits 287_1, 287_2, 287_3, and 287_4. Activating circuits 285_1, 285_2, 285_3, and 285_4 can include providing (e.g., applying) voltages to signals GG$_A$ and GG$_R$. Activating circuits 287_1, 287_2, 287_3, and 287_4 can include providing (e.g., applying) voltages to signal GG'$_B$.

The voltages provided to each of signal GG$_A$, GG$_B$, and GG'$_B$ can have different values for different operations of memory device 200. For example, the values of the voltages provided to signals GG$_A$, GG$_B$, and GG'$_B$ during an erase operation can be much higher (e.g., two times or higher) than the values of the voltages provided to signals GG$_A$, GG$_B$, and GG'$_B$ during a read or write operation.

During an operation of memory device 200, one or both select circuits associated with a selected memory cell string can be activated (e.g., by turning on the transistors in the select circuits), depending on which operation memory device 200 performs on the selected memory cell string. During an operation of memory device 200, memory device 200 can select a memory cell of a particular memory cell string as a selected memory cell in order to store information in (e.g., during a write operation) or to retrieve information from (e.g., during a read operation) the selected memory cell. During an erase operation, memory device 200 can select a block as a selected block to erase information from memory cells in a portion (e.g., a sub-block) of the selected block or memory cells from the entire selected block.

Activating a particular select circuit among select circuits 247 through 252 during an operation of memory device 200 can include providing (e.g., applying) voltages having certain values to signals SGD$_A$ and SGD$_B$ associated with that particular select circuit. Activating a particular select circuit among select circuits 247' through 252' can include providing (e.g., applying) voltages having certain values to signals SGS$_A$ and SGS$_B$ associated with that particular select circuit. When a particular select circuit among select circuits 241 through 252 is activated during a particular operation, it can couple (e.g., form a current path from) a selected memory cell string associated with that particular select circuit to a respective data line (e.g., one of lines 270, 271, or 272) through a respective circuit among circuits 285_1, 285_2, 285_3, and 285_4 (which is also activated during that particular operation). When a particular select circuit among select circuits 241' through 252' is activated, it can couple (e.g., form a current path from) a selected memory cell string associated with that particular select circuit to a source (e.g., line 299) through a respective circuit among circuits 287_1, 287_2, 287_3, and 287_4 (which is also activated during that particular operation).

Figure 2B:
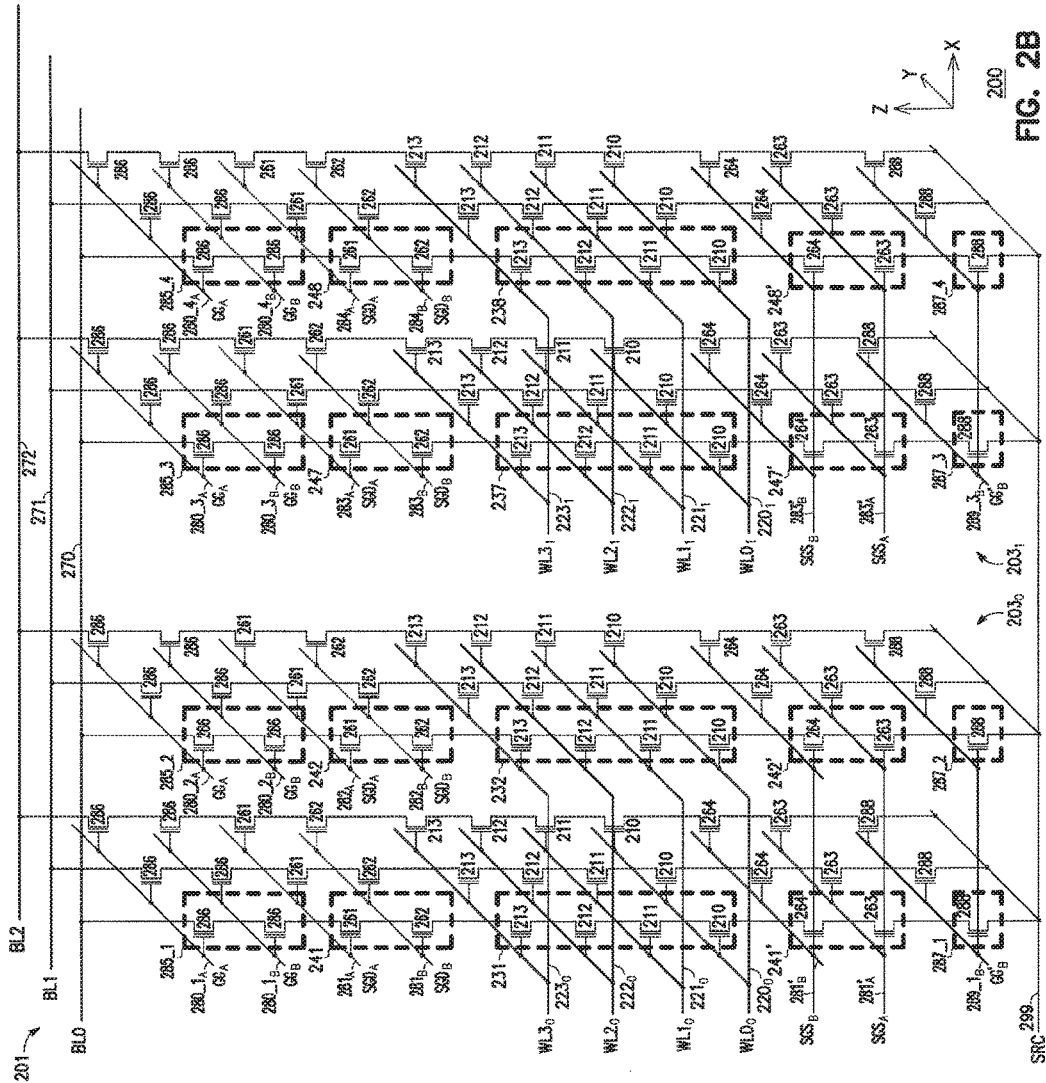
FIG. 2B shows a schematic diagram of the memory device of FIG. 2A, according to some embodiments described herein.

FIG. 2B shows a schematic diagram of memory device 200 of FIG. 2A, according to some embodiments described herein. For simplicity, FIG. 2B shows labels for only four memory cell strings 231, 232, 237 and 238, eight select circuits 241, 242, 247, 248, 241', 242', 247', and 248', and labels for some of the top GIDL current generator circuits (e.g., 285_1, 285_2, 285_3, and 285_4) and some of the bottom GIDL current generator circuits (e.g., 287_1, 287_2, 287_3, and 287_4).

As shown in FIG. 2B, memory device 200 can include memory cells 210, 211, 212, and 213, select gates (e.g., drain select gates) 261 and 262 and select gates (e.g., source select gates) 263 and 264 that can be physically arranged in three dimensions (3-D), such as x, y, and z dimensions with respect to the structure (shown in FIG. 3) of memory device 200.

In FIG. 2B, each of the memory cell strings (e.g., strings 231, 232, 237 and 238) of memory device 200 can include one of memory cells 210, one of memory cells 211, one of memory cells 212, and one of memory cells 213 coupled in series among each other. FIG. 2B shows an example where memory device 200 has four levels (e.g., four tiers) of respective memory cells 210, 211, 212, and 213 and four memory cells in each of the memory cell strings. The number of levels (e.g., tiers) of memory cells of memory device 200 can vary. Thus, the number of memory cells in each memory cell string can also vary. Further, one skilled in the art would recognize that some of the memory cells among memory cells 210, 211, 212, and 213 of memory cell strings 231, 232, 237 and 238, may be dummy memory cells. Dummy memory cells are memory cells that are not configured to store information. Dummy memory cells may be configured for purposes known to those skilled in the art. In some examples of memory device 200, one or two (or more) of memory cells at the two ends of each memory cell strings 231, 232, 237 and 238 (e.g., memory cells immediately next to select gates 262, select gates 264, or both select gates 262 and 264) may be dummy memory cells.

As shown in FIG. 2B, memory device 200 can include transistors 286 and 288. Each of circuits 285_1, 285_2, 285_3, and 285_4 can include two of transistors 286. Each of circuits 287_1, 287_2, 287_3, and 287_4 can include one of transistors 288. Each of transistors 286 and 288 can operate as a switch during a read or write operation of memory device 200. During a read or write operation, signals GG$_A$, GG$_B$, and GG'$_B$ at particular current generator circuits (among circuits 285_1, 285_2, 285_3, 285_4, 287_1, 287_2, 287_3, and 287_4) associated with selected memory cell strings of a selected block (e.g., block 203$_0$ or 203$_1$) can be provided with voltages, such that transistors 286 and 288 associated with those particular current generator circuits can be turned on. During an erase operation, signal GG$_A$, GG$_B$, and GG'$_B$ of a selected block can be provided with voltages to cause transistors 286 and 288 of the selected block to be in a condition such that GIDL current can be generated to help improve the erase operation of memory device 200.

As shown in FIG. 2B, each of select circuits 241, 242, 247, and 248 can include two select gates (e.g., two drain select gates): one of select gates 261 and one of select gates 262. Each of select circuits 241', 242', 247', and 248' can include two select gates (e.g., two source select gates): one of select gates 263 and one of select gates 264. Each of select gates 261, 262, 263, and 264 can operate as a transistor. FIG. 2B shows each of select gates 261, 262, 263, and 264 and transistors 286 and 288 as having the same structure as memory cells 210, 211, 212, and 213 as an example. In some examples of memory device 200, some or all of select gates 261, 262, 263, and 264 and transistors 286 and 288 can have a structure (e.g., a structure of a field effect transistor (FET)) different from the structure of memory cells 210, 211, 212, and 213).

In memory device 200, a select line (e.g., a drain select line 281$_A$, 282$_A$, 283$_A$, 284$_A$, 281$_B$, 282$_B$, 283$_B$, or 284$_B$, or a source select line 281'$_A$, 281', 283'$_A$, or 283'$_B$) can carry a signal (e.g., signal SGD$_A$, SGD$_B$, SGS$_A$, or SGS$_B$) but a select line does not operate like a switch (e.g., a transistor). A select gate (e.g., a drain select gate 261 or 262 or a source select gate 263 and 264) can receive a signal from a respective select line and can operate like a switch (e.g., a transistor).

In this description, a line (e.g., any of drain select lines $281_A$, $282_A$, $283_A$, $284_A$, $281_B$, $282_B$, $283_B$, and $284_B$, any of source select lines $281'_A$, $281'$, $283'_A$, and $283'$, any of transistor gate lines $280\_1_A$, $280\_2_A$, $280\_3_A$, $280\_4_A$, $280\_1_B$, $280\_2_B$, $280\_3_B$, $280\_4_B$, $289\_1_A$, $289\_3_A$ (FIG. 5A), $289\_1$, and $289\_3_B$, and any of control lines $220_0$ through $223_0$ and $220_1$ through $223_1$) includes a piece of conductive material, a region of conductive material, a layer of conductive material, or any shape of a structure that can carry an electrical signal. Thus, in this description, a line includes a "line" shape structure and any other structural shapes (e.g., a region of any shape, a layer shape, and other shapes).

In order to focus on the embodiments discussed herein, the description below with reference to FIG. 2C and FIG. 2D focuses on four memory cell strings 231, 232, 237, and 238, select circuits 241, 242, 247, 248, 241', 242', 247', and 248', some of the current generators circuits (e.g., circuits 285_1, 285_2, 285_3, 285_4, 287_1, 287_2, 287_3, and 287_4). Other memory cell strings, select circuits, and current generator circuits of memory device 200 have similar structures and connections.

Figure 2C:
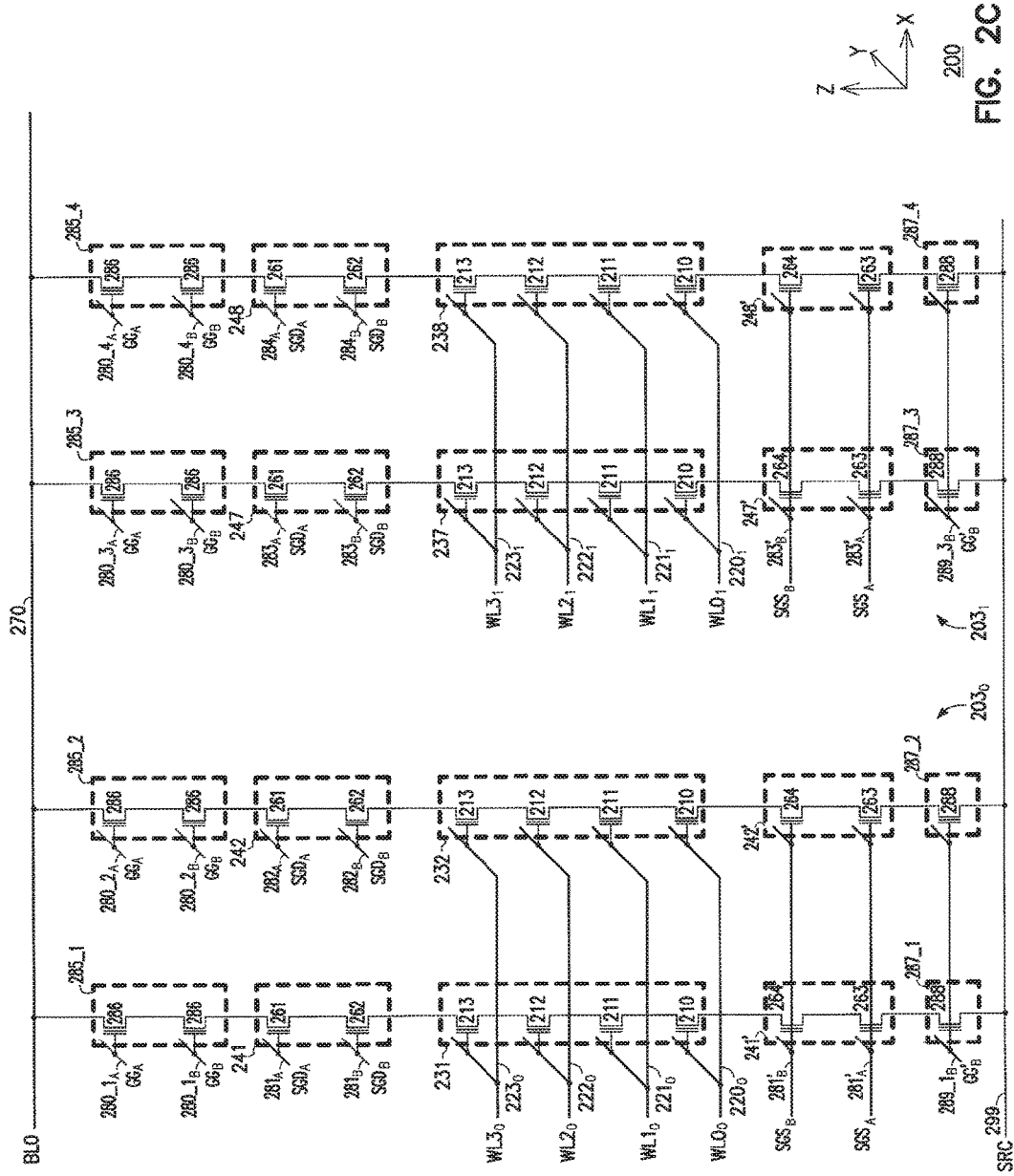
FIG. 2C shows a schematic diagram of a portion of the memory device of FIG. 2B, according to some embodiments described herein.

FIG. 2C shows a schematic diagram of a portion of memory device 200 of FIG. 2B including line 270, circuits 285_1, 285_2, 285_3, 285_4, select circuits 241, 242, 247, and 248, memory cell strings 231, 232, 237, and 238, select circuits 241', 242', 247', and 248', circuits 287_1, 287_2, 287_3, and 287_4, and line 299, according to some embodiments described herein. As shown in FIG. 2C, select gates 261 and 262 of each of select circuits 241, 242, 247, and 248 can be coupled in series with two of transistors 286 between line 270 and a respective memory cell string among memory cell strings 231, 232, 237, and 238. Select gates 263 and 264 of each of select circuits 241', 242', 247', and 248' can be coupled in series with a transistor among transistors 288 between line 299 and a respective memory cell string among memory cell strings 231, 232, 237, and 238.

Select gate 261 of select circuit 241 has a terminal (e.g., a transistor gate) that can be part of (e.g., formed by a portion of) select line $281_A$. Select gate 262 of select circuit 241 has a terminal (e.g., a transistor gate) that can be part of (e.g., formed by a portion of) select line $281_B$. Select gates 261 and 262 of select circuit 241 can be controlled (e.g., turned on or turned off) by signals $SGD_A$ and $SGD_B$ provided to select lines $281_A$ and $281_B$, respectively.

Select gate 263 of select circuit 241' has a terminal (e.g., a transistor gate) that can be part of (e.g., formed by a portion of) select line $281'_A$. Select gate 264 of select circuit 241' has a terminal (e.g., a transistor gate) that can be part of (e.g., formed by a portion of) select line $281'_B$. Select gates 263 and 264 of select circuit 241' can be controlled (e.g., turned on or turned off) by signals $SGS_A$ and $SGS_B$ provided to select lines $281'_A$ and $281'_B$, respectively.

Similarly, as shown in FIG. 2C, select gates 261 and 262 of each of select circuits 242, 247, and 248 also have terminals (transistor gates) that can be parts of (e.g., formed by portions of) respective select lines among select lines $282_A$, $283_A$, $284_A$, $282_B$, $283_B$, and $284_B$. Select gates 263 and 264 of each of select circuits 242', 247', and 248' also have terminals (transistor gates) that can be part of (e.g., formed by a portions of) respective select lines among select lines $281'_A$, $283'_A$, $281'_B$, and $283'_B$.

Each of transistors 286 and 288 has a terminal (e.g., a transistor gate) that can be part of (e.g., formed by a portion of) a respective transistor gate line. For example, transistor 286 of circuit 285_1 associated with signal $GG_A$ has a transistor gate that can be part of line (e.g., transistor gate line) $280\_1_A$. In another example, transistor 286 of circuit 285_1 associated with signal $GG_B$ has a transistor gate that can be part of line (e.g., transistor gate line) $280\_1_B$. In a further example, transistor 288 of circuit 287_1 has a transistor gate that can be part of line (e.g., transistor gate line) $289\_1_B$.

During an operation (e.g., a read or write operation) of memory device 200, select gates 261, 262, 263, and 264 and transistors 286 and 288 of particular select circuits associated with a selected memory cell string can be selectively activated (e.g., turned on) to couple the selected memory cell string to a respective data line (e.g., line 270, 271, or 272) and the source (e.g., line 299). For example, in FIG. 2C, during a write operation of memory device 200, if memory cell string 231 is a selected memory cell string, then select gates 261 and 262 of select circuit 241, transistors 286 of circuits 285_1, and transistor 288 of circuit 287_1 can be activated to couple memory cell string 231 to line 270; select gates 263 and 264 of select circuit 241' may not be activated in this example.

In another example, in FIG. 2C, during a read operation of memory device 200, if memory cell string 231 is a selected memory cell string, then select gates 261 and 262 of select circuit 241 and transistors 286 of circuits 285_1, and transistor 288 of circuit 287_1 can be activated to couple memory cell string 231 to line 270; select gates 263 and 264 of select circuit 241' can also be activated in this example to couple memory cell string 231 to line 299. In these two examples here, while memory cell string 231 is selected, memory cell strings 232, 237, and 238 can be deselected. Thus, select gates 261, 262, 263, and 264 in select circuits 242, 247, 248, 242', 247', and 248' (associated with memory cell strings 232, 237, and 238 that are deselected) and transistors 286 of circuits 285_2, 285_3, and 285_4 can be deactivated (e.g., turned off) to decouple memory cell strings 232, 237, and 238 from line 270 and line 299.

Figure 2D:
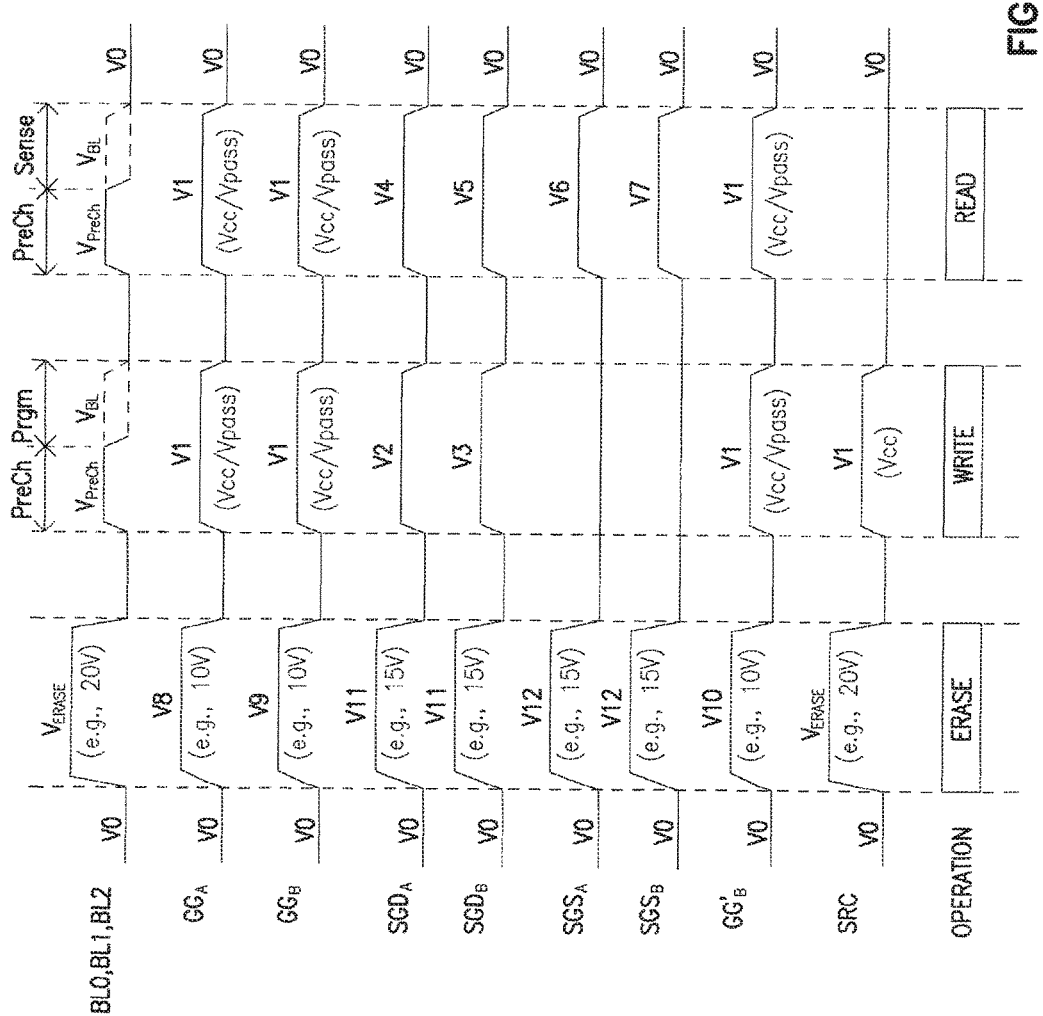
FIG. 2D shows example waveforms of some of the signals of the memory device of FIG. 2A through FIG. 2C during example erase, write, and read operations, according to some embodiments described herein.

In an erase operation of memory device 200, signals $SGD_A$, $SGD_B$, $SGS_A$, and $SGS_B$ on respective drain and source select gates of a selected block (a block selected to erase information from it) can be provided with voltages having values much higher than the values of voltages provided to these signals during a read or write operation (example values shown in FIG. 2D). As described above with reference to FIG. 2A, signals $GG_A$, $GG_B$, and $GG'_B$ on respective transistor gate lines of a selected block can be provided with voltages having values much higher than the values of voltages provided to the these signals during a read or write operation (example values shown in FIG. 2D). In a deselected block of memory device 200 during read, write, and erase operations, the signals in the deselected block can be deactivated.

FIG. 2D shows example waveforms of signals BL0, BL1, BL2, $GG_A$, $GG_B$, $SGD_A$, $SGD_B$, $SGS_A$, $SGS_B$, $GG'_B$, and SRC of memory device 200 (FIG. 2A through FIG. 2C) during example erase, write, and read operations, according to some embodiments described herein. Signals $SGD_A$, $SGD_B$, $SGS_A$, and $SGS_B$ shown in FIG. 2D are associated with a block (e.g., either block $203_0$ or block $203_1$) of memory device 200 that is selected during the example erase, write, and read operations. FIG. 2D omits other signals (e.g., some of signals shown in FIG. 2C) of memory device 200 to help focus on the embodiments of the memory device described herein. During erase, write, and read operations of memory device 200, the omitted signals can be provided with voltages having values known to those skilled in the art.

The specific values of the voltages associated with erase, write, and read operations shown in FIG. 2D and in this description here are example values. Other voltage values may be used.

The following description refers to FIG. 2B, FIG. 2C, and FIG. 2D. In FIG. 2D, each of voltages $V_{ERASE}$ can have a value greater than the value of each of voltages V1 through V12, $V_{PreCh}$, $V_{BL}$, and V0. Voltage V0 can be 0V (e.g., ground potential, such as Vss). Each of voltages V1 through V12 can have a positive value (e.g., a value greater than the value of voltage V0). Voltage $V_{ERASE}$ can have a value of approximately 20V. Voltage V1 can be either voltage Vcc (e.g., a supply voltage of memory device 200) or voltage Vpass. Voltage Vcc can have a value of approximately between 1V and 3V (or other values). Voltage Vpass can have a value that can cause unselected memory cells of a selected memory cell string to operate as an active conductive path (e.g., to conduct current) during a read or write operation. Voltage Vpass can have a value of approximately 3V to 5V (or other values). Voltage $V_{PreCh}$ can have a value between 0.5V up to the value of voltage Vcc. Each of voltages V2 through V7 can have a value equal to the value of voltage Vcc or other values to turn on respective drain select gates (e.g., 261 and 262 in FIG. 2C) and source select gates (e.g., 263 and 264 in FIG. 2C) during write and read operations. Voltages V8, V9, and V10 can have the same value. Voltages V11 and V12 can have the same value. As an example, when voltage $V_{ERASE}$ has a value of approximately 20V, each of voltages V8, V9, and V10 can have a value of approximately 10V, and each of voltages V11 and V12 can have a value of approximately 15V.

During the write operation, voltage $V_{BL}$ can have a value that depends on the value (e.g., value of a bit) of information to be stored in a selected memory cell. During the read operation, voltage $V_{BL}$ can have a value that depends on the value (e.g., value of a bit) of information sensed from a selected memory cell.

As shown in FIG. 2D, during the erase operation, signals BL0, BL1, and BL2 and SRC can be provided with a voltage $V_{ERASE}$ to erase information stored in memory cells 210, 211, 212, and 213 of the memory strings of a selected block (e.g., block $203_0$ or block $203_1$ in FIG. 2C). Transistors 286 and 288 (FIG. 2C) can operate to generate GIDL current (e.g., operate as GIDL current generators) to help the erase operation. For example, the GIDL current generated by transistors 286 and 288 during the erase operation may speed up the charging of the body of the memory cell strings in the selected block.

As shown in FIG. 2D, the write operation of memory device 200 can have different stages, such as a write precharge stage (shown as "PreCh" during the write operation in FIG. 2D) and a program stage (shown as "Prgm" in FIG. 2D) after the write precharge stage. During the write precharge stage, signals BL0, BL1, and BL2 can be provided with precharge voltage $V_{PreCh}$. During the program stage, signals BL0, BL1, and BL2 can have voltage $V_{BL}$, V0, or a voltage having a value between the values of voltages V0 and $V_{BL}$, depending on the value of information to be stored in a selected memory cell of a memory cell string coupled to a respective line among lines 270, 271, and 272 (associated with signals BL0, BL1, and BL2). During the write operation, signals $GG_A$, $GG_B$, and $GG'_B$ can be provided with voltage V1, such that transistors 286 and 288 (FIG. 2C) can be activated (e.g., turned on); and signal SRC can be provided with voltage V1 (e.g., Vcc). During the write operation, signals $SGD_A$ and $SGD_B$ can be provided with voltages V2 and V3, respectively, and signals $SGS_A$ and $SGS_B$ can be provided with voltage V0.

The read operation of memory device 200, as shown in FIG. 2D, can have different stages, such as a read precharge stage (shown as "PreCh" during a read operation in FIG. 2D) and a sense stage (shown as "Sense" in FIG. 2D) after the read precharge stage. During the read precharge stage, signals BL0, BL1, and BL2 can be provided with precharge voltage $V_{PreCh}$. During the sense stage, signals BL0, BL1, and BL2 can have voltage $V_B$ or V0, depending on the value of information sensed from a selected memory cell of a memory cell string coupled to a respective line among lines 270, 271, and 272 (associated with signals BL0, BL1, and BL2). During the read operation, signals $GG_A$, $GG_B$, and $GG'_B$ can be provided with voltage V1, such that transistors 286 and 288 (FIG. 2C) can be activated (e.g., turned on); and signal SRC can be provided with voltage V0. During the read operation, signals $SGD_A$ and $SGD_B$ can be provided with voltages V4 and V5, respectively; and signals $SGS_A$ and $SGS_B$ can be provided with voltages V6 and V7, respectively.

Figure 3:
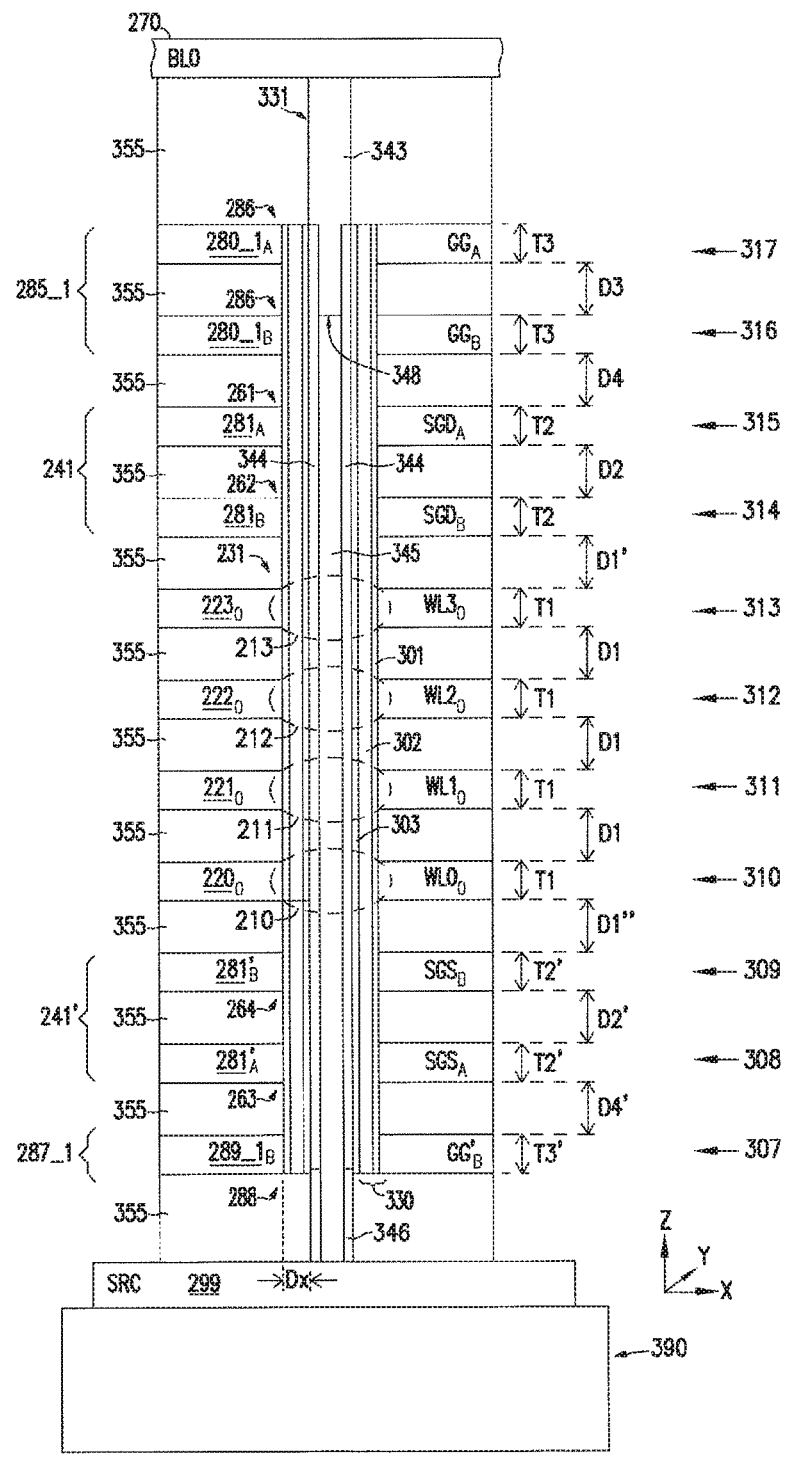
FIG. 3 shows a side view of a structure of a portion of the memory device of FIG. 2A through FIG. 2C, according to some embodiments described herein.

FIG. 3 shows a side view of a structure of a portion of memory device 200, according to some embodiments described herein. The structure of memory device 200 in FIG. 3 corresponds to part of the schematic diagram of memory device 200 shown in FIG. 2C. For simplicity, FIG. 3 shows the structure of memory device 200 that includes line 270 (and associated signal BL0), circuit (e.g., current generator circuit) 285_1, select circuit 241, memory cell string 231, control lines $220_0$, $221_0$, $222_0$, and $223_0$, select circuit 241', and circuit (e.g., current generator circuit) 287_1. Other similar elements of memory device 200 in FIG. 2A, FIG. 2B, and FIG. 2C can have structures such as the ones shown in FIG. 3.

As shown in FIG. 3, memory device 200 can include a substrate 390 over which memory cells 210, 211, 212, and 213 of memory cell string 231 can be formed (e.g., formed vertically with respect to substrate 390). Memory device 200 includes different levels 307 through 317 with respect to a z-dimension. Levels 307 through 317 are internal device levels between substrate 390 and line 270 of memory device 200.

As shown in FIG. 3, memory cells 210, 211, 212, and 213 can be located in levels 310, 311, 312, and 313, respectively. Control lines $220_0$, $221_0$, $222_0$, and $223_0$ (associated with memory cells 210, 211, 212, and 213, respectively) can also be located in levels 310, 311, 312, and 313, respectively.

Select lines $281_A$ and $281_B$ can be located in different levels (e.g., levels 315 and 314, respectively), such that memory cell string 231 is between select lines $281_A$ and 281B and substrate 390. Select lines $281'_A$ and $281'_B$ can be located in different levels (e.g., levels 308 and 309, respectively) between substrate 390 and memory cell string 231.

Lines (e.g., transistor gate lines) $280\_1_A$ and $280\_1_B$ can be located in different levels (e.g., levels 317 and 316, respectively), such that select lines $281_A$ and $281_B$ are between lines $280\_1_A$ and $280\_1_B$ and memory cell string 231. Line (e.g., transistor gate line) $289\_1_B$ can be located in level 307, such that line $289\_1_B$ is between select lines $281'_A$ and $281'_B$ and substrate 390.

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type). Although not shown in FIG. 3, substrate 390 can include circuitry that can be located under memory array 201 (FIG. 2A), such as located directly under line 299 in FIG. 3. Such circuitry can include sense amplifiers, buffers (e.g., page buffers), decoders, and other circuit components of memory device 200.

As shown in FIG. 3, line 270 can have a length extending in the direction of an x-dimension, which is perpendicular to the z-dimension and perpendicular to the y-dimension. Line 270 can include a conductive material (e.g., conductively doped polycrystalline silicon (doped polysilicon), metals, or other conductive materials). Line 299 can include a conductive material. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390).

As shown in FIG. 3, memory device 200 can include a pillar 331 having a length extending outwardly (e.g., vertically in the direction of the z-dimension of memory device 200) from a conductive material region of line 299. Pillar 331 can include portions 343, 344, 345, and 346.

Portion 343 (conductive portion) of pillar 331 has length extending in the direction (in the z-dimension) of the length of pillar 331 and can be coupled (e.g., directly coupled) to line 270. For example, the material of portion 343 can directly contact a conductive material region (a portion of) line 270. Portion 343 can be called a plug (e.g., a conductive plug) of pillar 331. As described in more detail below, including portion 343 and circuit 285_1 (which includes transistors 286) may improve operations (e.g., erase operation) of memory device 200 over some conventional memory devices.

Portion 346 (conductive portion) of pillar 331 (FIG. 3) can be coupled (e.g., directly coupled) to line 299. For example, the material of portion 346 can directly contact a conductive material region (a portion of) line 299.

Portion 344 of pillar 331 has length extending in the direction (in the z-dimension) of the length of pillar 331 and can be between (e.g., vertically between) portions 343 and 346. Portion 344 and at least part of each of portions 343 and 346 can form a conductive channel (e.g., part of the body of memory cell string 231) in pillar 331. The conductive channel (formed at least by portion 344) has length extending in the direction (in the z-dimension) of the length of pillar 331 and can carry current (e.g., current between line 270 and line 299 (e.g., source)) during an operation (e.g., read, write, or erase) of memory device 200.

Portion 345 (dielectric portion) of pillar 331 can be surrounded (e.g., horizontally surrounded) by portions 344 and 346. During a process of forming pillar 331 of memory device 200, pillar 331 can have a hollow core (e.g., an empty core) before portion 345 is formed. Portion 345 in FIG. 3 can include a dielectric material (e.g., silicon dioxide) that occupies (e.g., fills) the hollow core (as shown in FIG. 3), such that portion 344 can surround at least part of portion 345.

Each of portions 343, 344, and 346 can include conductive material (e.g., doped polycrystalline silicon). Portions 343, 346, and 344 can include materials of the same conductivity type but different doping concentrations. For example, portions 343, 346, and 344 can include a semiconductor material of n-type (e.g., n-type polycrystalline silicon), but each of portions 343 and 346 can have a doping concentration (n-type impurities (e.g., arsenic or phosphorous)) higher than the doping concentration (n-type impurities (e.g., arsenic or phosphorous)) of portion 344.

Alternatively, portions 343 and 346 can include materials of the same conductivity type, and portion 344 can include a material having a different conductivity type from that of portions 343 and 346. For example, portions 343 and 346 can include a semiconductor material of n-type (e.g., n-type polycrystalline silicon), and portion 344 can include a semiconductor material of p-type (e.g., p-type polycrystalline silicon). Each of portions 343 and 346 can have a doping concentration (n-type impurities (e.g., arsenic or phosphorous)) higher than the doping concentration (e.g., p-type impurities (e.g., boron)) of portion 344.

As shown in FIG. 3, memory device 200 includes an interface 348 in pillar 331. Interface 348 is the location where portion 343 (e.g., the bottom of the material of portion 343) contacts portion 345 (e.g., contact the top of the material of portion 345). FIG. 3 shows an example where interface 348 (e.g., the bottom of portion 343) is located (e.g., positioned) at approximately level 316. However, interface 348 can be located (e.g., positioned) at another location in pillar 331 (e.g., at a location between level 315 and 317). As described below with reference to FIG. 4, the structure of memory device 200 can allow its operations (e.g., erase operation) to be less susceptible to process variations (process of forming memory device 200), thereby suppressing the effect of process variations on operations of memory device 200. This allows memory device 200 to maintain its operations even if the location of interface 348 may deviate from its intended location (e.g., due to process variations). The structure of memory device 200 can also allow it to generate a relatively higher amount of erase GIDL current that further helps erase operations of memory device 200.

As shown in FIG. 3, memory cells 210, 211, 212, and 213 of memory cell string 231 can be located along a segment of pillar 331 (e.g., the segment of pillar 331 extending from level 310 to level 313). Control lines $220_0$, $221_0$, $222_0$, $223_0$ (associated with respective memory cells 210, 211, 212, and 213) can also be located along a segment (e.g., the segment extending from level 310 to level 313) of pillar 331. The materials of control lines $220_0$, $221_0$, $222_0$, $223_0$ can include a conductive material (e.g., conductively doped polycrystalline silicon of n-type, metals, or other conductive materials).

Transistor 286 associated with line (e.g., transistor gate line) $280\_1_A$ can be located in level 317 along a segment (segment at level 317) of pillar 331. Line $280\_1_A$ can also be located in level 317 along a segment (segment at level 317) of pillar 331.

Transistor 286 associated with line (e.g., transistor gate line) $280\_1_B$ can be located in level 316 along a segment (segment at level 316) of pillar 331. Line $280\_1_B$ can also be located in level 316 along a segment (segment at level 316) of pillar 331.

Select line $281_A$ can be located in level 315 along a segment (segment at level 315) of pillar 331. Select line $281_B$ can be located in level 314 along a segment (segment at level 314) of pillar 331.

Select line $281'_B$ can be located in level 309 along a segment (segment at level 309) of pillar 331. Select line $281'_A$ can be located in level 308 along a segment (segment at level 308) of pillar 331.

Transistor 288 associated with line (e.g., transistor gate line) $289\_1_B$ can be located in level 307 along a segment (segment at level 307) of pillar 331. Line $289\_1_B$ can also be located in level 307 along a segment (segment at level 307) of pillar 331.

The materials of lines $280\_1_A$, $280\_1_B$, and $289\_1_B$ and select lines $281_A$, $281_B$, $281'A$, and $281'_B$ can include conductively doped polycrystalline silicon, metals, or other conductive materials. The materials of lines $280\_1_A$, $280\_1$, and $289\_1_B$ and select lines $281_A$, $281_B$, $281'_A$, and $281'_B$ can be the same as the conductive material of control lines $220_0$, $221_0$, $222_0$, $223_0$.

As shown in FIG. 3, memory device 200 can include a structure 330, which includes portions 301, 302, and 303 between pillar 331 and control lines $220_0$, $221_0$, $222_0$, $223_0$. Each of memory cells 210, 211, 212, and 213 of memory cell string 231 can include part of structure 330 (part of portions 301, 302, and 303 at respective levels 310, 311, 312, and 313). For example, part of portion 302 at a particular memory cell among memory cells 210, 211, 212, and 213 can be a charge storage structure (e.g., a memory portion) of that particular memory cell and can be configured to store information in that particular memory cell.

Structure 330 can be part of a TANOS (TaN, $Al_2O_3$, $Si_3N_4$, $SiO_2$, Si) structure. For example, portion 301 (e.g., interpoly dielectrics) can include a charge blocking material or materials (e.g., a dielectric material such as TaN and $Al_2O_3$) that are capable of blocking a tunneling of a charge. Portion 302 can include a charge storage element (e.g., charge storage material or materials, such as $Si_3N_4$ or other dielectric materials) that can provide a charge storage function (e.g., trap charge) to represent a value of information stored in memory cells 210, 211, 212, or 213. Thus, in this example, the charge storage structure (part of portion 302) in each of memory cells 210, 211, 212, and 213 that is configured to store information is a dielectric structure, which can include a dielectric material (e.g., $Si_3N_4$). Portion 303 can include a tunnel dielectric material or materials (e.g., $SiO_2$) that are capable of allowing tunneling of a charge (e.g., electrons). As an example, portion 303 can allow tunneling of electrons from portion 344 to portion 302 during a write operation and tunneling of electrons from portion 302 to portion 344 during an erase operation of memory device 200.

In an alternative arrangement of memory device 200, structure 330 can be part of a SONOS (Si, $SiO_2$, $Si_3N_4$, $SiO_2$, Si) structure. In this alternative arrangement, in each of memory cells 210, 211, 212, and 213, the memory portion (part of portion 302) can be a dielectric material (e.g., $Si_3N_4$) portion.

In another alternative arrangement of memory device 200, structure 330 can be part of a floating gate structure. In this alternative arrangement, the charge storage structure (part of portion 302) in each of memory cells 210, 211, 212, and 213 that is configured to store information can be a polycrystalline silicon structure.

As shown in FIG. 3, a select line (e.g., $281_A$, $281_B$, $281'_A$, or $281'_B$) is a piece (e.g., a single layer) of conductive material (e.g., polycrystalline silicon, metal, or other conductive materials). As described above, a select line can carry a signal (e.g., signal $SGD_A$, $SGD_B$, $SGS_A$, or $SGS_B$ in FIG. 2C) but it does not operate like a switch (e.g., a transistor). A select gate (e.g., each of select gates 261, 262, 263, and 264) can include a portion of a respective select line (e.g., a portion of the piece of the conductive material that forms the respective select line) and additional structures to perform a function (e.g., function of a transistor). For example, in FIG. 3, select gate 261 can include a portion of select line $281_A$ and a portion of structure 330, select gate 262 can include a portion of select line $281_B$ and a portion of structure 330, select gate 263 can include a portion of select line $281'_A$ and a portion of structure 330, and select gate 264 can include a portion of select line $281'_B$ and portion of structure 330.

Similarly, as shown in FIG. 3, a transistor gate line (e.g., $280\_1_A$, $280\_1$, or $289\_1_B$) is a piece (e.g., a single layer) of conductive material (e.g., polycrystalline silicon, metal, or other conductive materials). A transistor gate line can carry a signal (e.g., signal $GG_A$, $GG_B$, or $GG'_B$ in FIG. 2C) but a transistor gate line does not operate like a switch (e.g., a transistor). A transistor (e.g., each of transistors 286 and 288) associated with a transistor gate line (e.g., $280\_1_A$, $280\_1_B$, or $289\_1_B$) can include a portion of a respective transistor gate line (e.g., a portion of the piece of the conductive material that forms the respective transistor gate line) and additional structures to perform a function of a transistor. For example, in FIG. 3, transistors 286 can include respective portions of lines $280\_1_A$ and $280\_1_B$ and respective portions of structure 330, and transistor 288 can include a portion of line $289\_1_B$ and a portion of structure 330.

FIG. 3 shows an example where transistors 286 and 288 and select gates 261, 262, 263, and 264 have the same structure (e.g., TANOS structure) as memory cells 210, 211, 212, and 213. Alternatively, some or all of transistors 286 and 288 and select gates 261, 262, 263, and 264 can have a different structure, such as an FET structure. An example of an FET includes a metal-oxide semiconductor (MOS) transistor structure. As is known to those skilled in the art, an FET usually includes a transistor gate, a transistor body channel, and a gate oxide between the transistor gate and the transistor body channel that can be in direct contact with the transistor gate and the transistor body channel.

As shown in FIG. 3, two adjacent control lines (two control lines located immediately vertically next to each other in the direction of the z-dimension) among control lines $220_0$, $221_0$, $222_0$, and $223_0$ are vertically separated from each other by a distance (e.g., spacing) D1. Select lines $281_A$ and $281_B$ are vertically separated from each other by a distance (e.g., spacing) D2. Select lines $281'_A$ and $281'_B$ are vertically separated from each other by a distance (e.g., spacing) D2'. Distances D2 and D2' can be the same (e.g., substantially equal). Each of distances D2 and D2' can be the same as distance D1.

Lines $280\_1_A$ and $280\_1$ are vertically separated from each other by a distance (e.g., spacing) D3. Line $280\_1_B$ can be vertically separated from select line $281_A$ by a distance (e.g., spacing) D4. Line $289\_1_B$ can be vertically separated from select line $281'_A$ by a distance (e.g., spacing) D4'. Each of distances D3, D4, and D4' can be the same as distance D1. Thus, as described above, distances (e.g., vertical distances) D1, D2, D2', D3, D4, and D4' can be the same.

As shown in FIG. 3, distance D1 is a vertical distance (e.g., vertical spacing) measured from the nearest top or bottom edge (surfaces directly facing each other with respect to the z-dimension) of any of two vertically adjacent control lines. As described above, each of control lines $220_0$, $221_0$, $222_0$, and $223_0$ can be formed from a conductive material (e.g., metal or another conductive material). Thus, distance D1 can be measured between two nearest edges of the materials that form two adjacent control lines. For example, distance D1 can be measured from the nearest edges of the materials that form control lines $220_0$ and $221_0$, the nearest edges of the materials that form control lines $221_0$ and $222_0$, or the nearest edges of the materials that form control lines $222_0$ and $223_0$.

Distance D2 is a vertical distance (e.g., vertical spacing) measured from the nearest top or bottom edge (surfaces directly facing each other with respect to the z-dimension) of select lines $281_A$ and $281_B$. As described above, select lines $281_A$ and $281_B$ can be formed from a conductive material (e.g., metal or another conductive material). Thus, distance D2 can be measured between two nearest edges of the materials that form select lines $281_A$ and $281_B$.

Distance D2' is a vertical distance (e.g., vertical spacing) measured from the nearest top or bottom edge (edges with respected to the z-dimension sides directly facing each other with respect to the z-dimension) of select lines $281'_A$ and $281'_B$. As described above, select lines $281'_A$ and $281'_B$ can be formed from a conductive material (e.g., metal or another conductive material). Thus, distance D2' can be measured between two nearest edges of the materials that form select lines $281'_A$ and $281'_B$.

FIG. 3 also shows distance D1' and D1" between elements in memory device 200. Distance D1' is a vertical distance (e.g., vertical spacing) between the select line (e.g., select line $281_B$ in this example) that is nearest to control lines $220_0$, $221_0$, $222_0$, and $223_0$, and the control line (e.g., $223_0$) that is nearest to select lines $281_A$ and $281_B$ (nearest to select line $281_B$ in this example). Thus, distance D1' can be measured between two nearest edges of the materials that form select line $281_B$ and control line $223_0$. Distance D1" is a vertical distance (e.g., vertical spacing) between the select line (e.g., select line $281'_B$ in this example) that is nearest to control lines $220_0$, $221_0$, $222_0$, and $223_0$ and the control line (e.g., $220_0$) that is nearest to select lines $281'_A$, and $281'_B$ (nearest to select line $281'_B$ in this example). Thus, distance D1" can be measured between two nearest edges of the materials that form select line $281'_B$ and control line $220_0$.

Distance D3 is a vertical distance (e.g., vertical spacing) measured from the nearest top or bottom edge (surfaces directly facing each other with respect to the z-dimension) of lines $280\_1_A$ and $280\_1_B$. As described above, select lines $280\_1_A$ and $280\_1_B$ can be formed from a conductive material (e.g., metal or another conductive material). Thus, distance D3 can be measured between two nearest edges of the materials that form lines $280\_1_A$ and $280\_1_B$.

Distance D4 is a vertical distance (e.g., vertical spacing) measured from the nearest top or bottom edge (surfaces directly facing each other with respect to the z-dimension) of lines $281_A$ and $280\_1_B$. Thus, distance D4 can be measured between two nearest edges of the materials that form lines $281_A$ and $280\_1_B$.

Distance D4' is a vertical distance (e.g., vertical spacing) measured from the nearest top or bottom edge (surfaces directly facing each other with respect to the z-dimension) of lines $281'_A$ and $289\_1_B$. Thus, distance D4' can be measured between two nearest edges of the materials that form lines $281'_A$ and $289\_1_B$.

As shown in FIG. 3, control lines $220_0$, $221_0$, $222_0$, and $223_0$, select lines $281_A$, $281_B$, $281'_A$, and 281', and lines $280\_1_A$, $280\_1_B$, and $289\_1_B$ are separated from portion 344 (e.g., a conductive channel) of pillar 331 by the same distance Dx (e.g., a horizontal distance with respect to the x-dimension). Distance Dx can be the thickness of structure 330 with respect to the x-dimension.

As shown in FIG. 3, each of control lines $220_0$, $221_0$, $222_0$, and $223_0$ has a thickness T1 in the z-dimension. Thickness T1 is a vertical thickness of the material of a respective control line among control lines $220_0$, $221_0$, $222_0$, and $223_0$. Each of select lines $281_A$ and $281_B$ has a thickness T2 in the z-dimension. Thickness T2 is a vertical thickness of the material of each of select lines $281_A$ and $281_B$. Each of select lines $281'_A$ and $281'_B$ has a thickness T2' in the z-dimension. Thickness T2' is a vertical thickness of the material of each of select lines $281'_A$ and $281'_B$.

Each of lines $280\_1_A$ and $280\_1_B$ has a thickness T3 in the z-dimension. Thickness T3 is a vertical thickness of the material of each of lines $280\_1_A$ and $280\_1_B$. Line $289\_1_B$ has a thickness T3' in the z-dimension. Thickness T3' is a vertical thickness of the material of each of line $289\_1_B$.

Thicknesses T1, T2, T2', T3, and T3' can be the same (e.g., substantially equal). Alternatively, thicknesses T2 and T2' can be the same (e.g., substantially equal), thicknesses T3 and T3' can be the same (e.g., substantially equal), and each of thicknesses T2, T2', T3, and T3' can be different from thickness T1.

As shown in FIG. 3, memory device 200 can include a dielectric (e.g., an oxide of silicon) 355 located between elements of memory device 200. For example, dielectric 355 can be located (e.g., occupy the space) between two adjacent control lines among control lines $220_0$, $221_0$, $222_0$, and $223_0$. Thus, distance D1 can be the thickness of the material (e.g., an oxide of silicon) of a respective dielectric (e.g., dielectric 355) between two adjacent control lines among control lines $220_0$, $221_0$, $222_0$, and $223_0$. Similarly, each of distances D1', D1", D2, D2', D3, D4, and D4' can be the thickness of the material of a respective dielectric (e.g., dielectric 355) between two adjacent elements as shown in FIG. 3.

Providing the structure of memory device 200 (e.g., transistor gate lines $280\_1_A$, $280\_1_B$, and $289\_1_B$ and associated transistors 286 and 288) as shown in FIG. 3 and operating it in ways as described above (e.g., FIG. 2D) allows memory device 200 to improve its operations. For example, GIDL current generated during an erase operation of memory device 200 may be improved (e.g., increased) with the inclusion of line $280\_1_A$ and transistors 286 in memory device 200 in comparison with memory device 200 without the inclusion of line $280\_1_A$ and transistors 286.

Further, by making thicknesses T1, T2, T2', T3, and T3' of the components (shown in FIG. 3) of memory device 200 the same, a simplified process of making memory device 200 can be achieved. For example, memory device 200 can be formed (e.g., fabricated) to provide improved GIDL current for its erase operations without modifying the thickness (e.g., T3 or T3') of one or more of lines $280\_1_A$, $280\_1_B$, and $289\_1_B$ (e.g., transistor gate lines in FIG. 3) to be different from (e.g., greater than) the thickness (e.g., T1) of control lines $220_0$, $221_0$, $222_0$, and $223_0$. In an alternative structure of memory device 200, the thickness of one or more of lines $280\_1_A$, $280\_1_B$, and $289\_1_B$ can be made greater than the thickness of control lines $220_0$, $221_0$, $222_0$, and $223_0$. However, such an alternative structure may cause forming memory device 200 to be more complicated than forming the structure of memory device 200 of FIG. 3 (where thicknesses T1, T2, T2', T3, and T3' are the same).

Moreover, as is known to those skilled in the art, process variations can affect (e.g., degrade) the operations of a memory device. However, the structure of memory device 200 (FIG. 3) can allow its operations (e.g., erase operation) to be less susceptible to process variations (process of forming memory device 200). This means that memory device 200 can have a relatively higher tolerance for process variations in comparison with memory device 200 without some of its components (e.g., without the inclusion of line $280\_1_A$ and transistors 286 associated with line $280\_1_A$). Additionally, the inclusion of line $280\_1_A$ and transistors 286 associated with line $280\_1_A$ allows operations (e.g., erase operations) of memory device 200 to be less susceptible to variations in doping concentration of dopants (e.g., n-type impurities) used to form portion 343, portion 346, or both.

Figure 4:
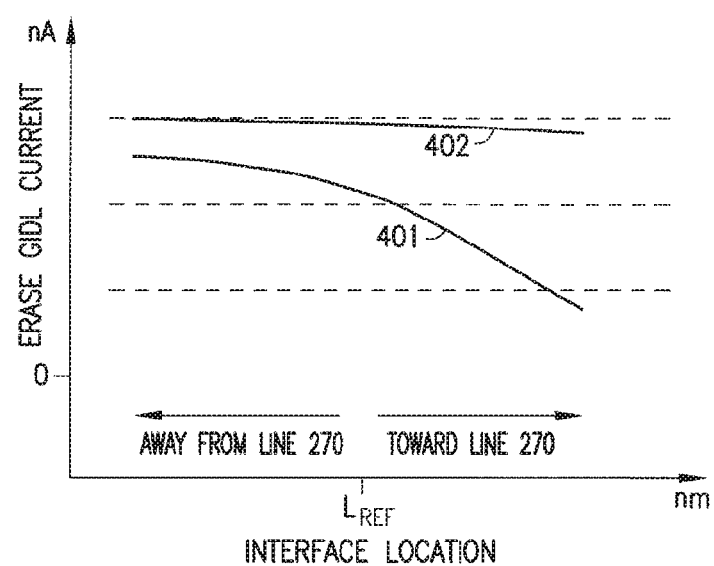
FIG. 4 is a graph showing an example relationship between the location of an interface in a pillar of the memory device of FIG. 3 and an erase GIDL current generated during an erase operation of the memory device, according to some embodiments described herein.

FIG. 4 is a graph showing an example relationship between the location (e.g., position) of interface 348 and erase GIDL current generated during an erase operation and of memory device 200 of FIG. 3, according to some embodiments described herein. The following description refers to FIG. 3 and FIG. 4. In FIG. 4, a reference location $L_{REF}$ can represent an intended (e.g., desired) location for interface 348 in memory device 200 at which erase GIDL current is expected (e.g., based on design simulation) to be at an intended amount (e.g., a desired amount) for an erase operation of memory device 200. As an example, reference location $L_{REF}$ of interface 348 can be the location in pillar 331 at level 316 as shown in FIG. 3.

In FIG. 4, the arrow showing a direction "away from line 270" indicates that the location of interface 348 in memory device 200 may deviate (e.g., due to process variations) from reference location $L_{REF}$ (e.g., an intended location) in a direction away from line 270. This means that the length of portion 343 in the z-dimension (after memory device 200 is formed) would be greater than the intended length of portion 343 if interface 348 moves (e.g., shifts) from reference location $L_{REF}$ in a direction way from line 270. The length of portion 343 can be the length of a conductive plug (e.g., an n-type material) that forms portion 343. The intended length of portion 343 can be measured from line 270 to the location of interface 348 at reference location $L_{REF}$ (e.g., an intended location).

In FIG. 4, the arrow showing a direction "toward line 270" indicates that the location of interface 348 in memory device 200 may deviate (e.g., due to process variations) from reference location $L_{REF}$ (e.g., an intended location) in a direction toward line 270. This means that the length of portion 343 in the z-dimension (after memory device 200 is formed) would be less than the intended length of portion 343 if interface 348 moves (e.g., shifts) from reference location $L_{REF}$ in a direction toward line 270.

In FIG. 4, curves 401 and 402 represent two example situations showing the effect of deviation (e.g., due to process variations) in the location of interface 348 on the amount of erase GIDL current in memory device 200. Curve 401 shows a situation where line $280\_1_A$ and transistor 286 (FIG. 3) are removed from memory device 200 (e.g., memory device 200 without line $280\_1_A$ and transistor 286). Curve 402 shows a situation where line $280\_1_A$ and transistor 286 are included in memory device 200 as shown in FIG. 2A through FIG. 3.

As shown by curve 401 (without line $280\_1_A$ and transistor 286 in memory device 200), the amount of erase GIDL current is lower if the location of interface 348 varies and moves from reference location $L_{REF}$ toward line 270 (moves closer to line 270). A lower amount of erase GIDL may degrade the erase operations of memory device 200.

In contrast, as shown by curve 402 (with line $280\_1_A$ and transistor 286 in memory device 200), the amount of erase GIDL current can remain relatively unchanged (e.g., remain stable) if the location of interface 348 varies and moves from reference location $L_{REF}$ in a direction either away from (farther from) line 270 or toward (closer to) line 270. Further, curve 402 also shows a higher amount of erase GIDL current than curve 401, meaning that that memory device 200 having line $280\_1_A$ and transistor 286 can generate more erase GIDL current than memory device 200 without line $280\_1_A$ and transistor 286.

In sum, with the inclusion of line $280\_1_A$ and transistors 286 in memory device 200, a relatively higher amount of erase current can be generated in memory device 200 in comparison with a situation where line $280\_1_A$ and transistors 286 are not included in memory device 200. Thus, the inclusion of line $280\_1_A$ and transistors 286 in memory device 200 can improve the erase operations of memory device 200. Moreover, since the inclusion of line $280\_1_A$ and transistors 286 in memory device 200 allows the amount of erase GIDL current to remain relatively unchanged in memory device 200, the operations (e.g., erase operations) of memory device 200 can be less susceptible to variations in the location of interface 348. This can improve the reliability of memory device 200.

Figure 5A:
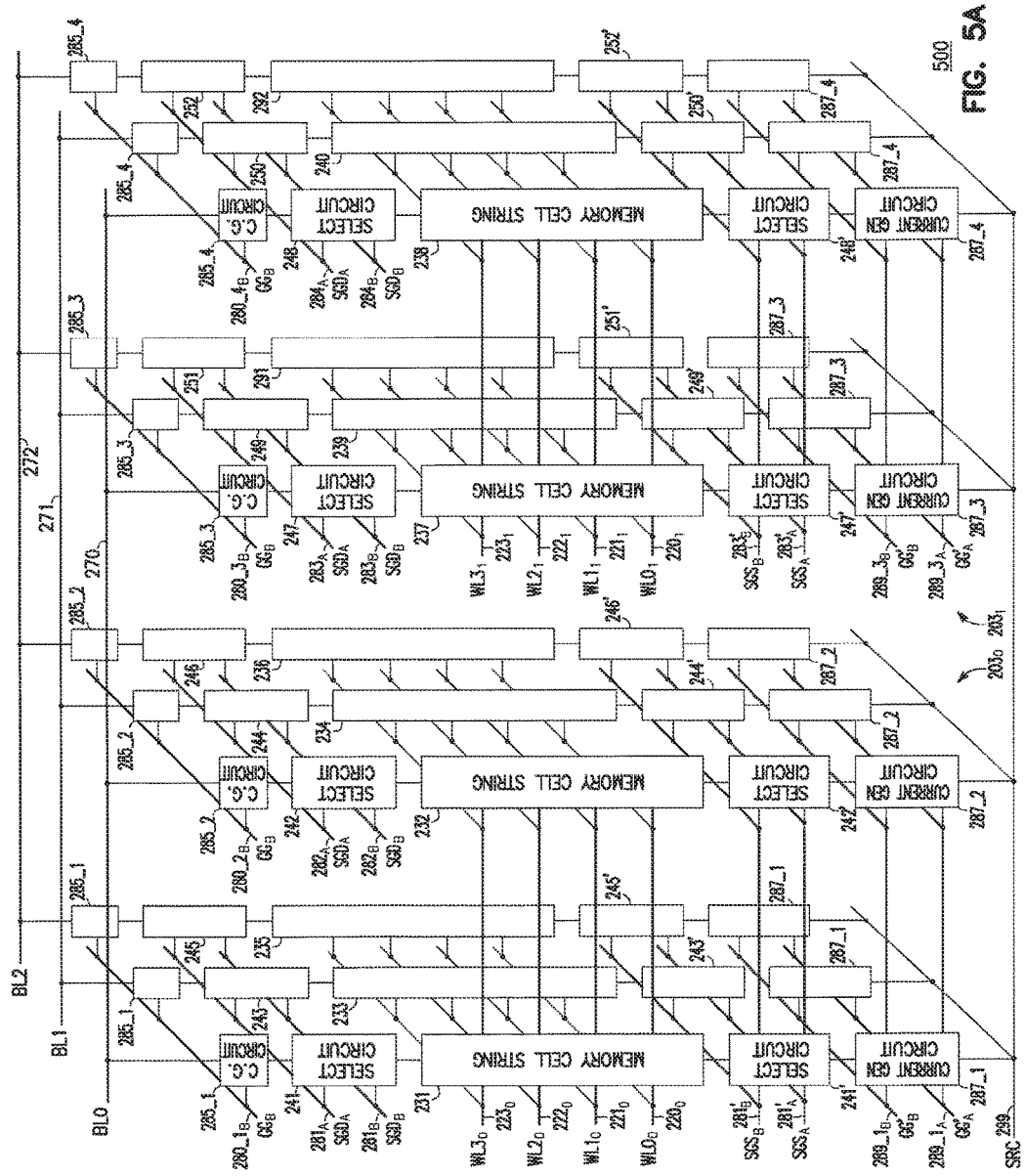
FIG. 5A shows a block diagram of a portion of a memory device, which can be a variation of the memory device of FIG. 2A, according to some embodiments described herein.

FIG. 5A shows a block diagram of a portion of a memory device 500, which can be a variation of memory device 200 of FIG. 2A, according to some embodiments described herein. Memory device 500 includes elements similar to or identical to those of memory device 200. For simplicity, the description of similar or identical elements between memory device 500 (FIG. 5A through FIG. 6) and memory device 200 (FIG. 2A through FIG. 3) is not repeated.

Differences between memory devices 200 and 500 include differences between transistor gate lines coupled to circuits (e.g., top GIDL current generator circuits) 285_1, 285_2, 285_3, and 285_4 and circuits (e.g., to bottom GIDL current generator circuits) 287_1, 287_2, 287_3, and 287_4 of devices 200 and 500. As shown in FIG. 5A, memory device 500 lacks lines (e.g., transistor gate lines) $280\_1_A$, $280\_2_A$, $280\_3_A$, and $280\_4_A$ and associated transistors 286. However, memory device 500 includes the addition of lines (e.g., transistor gate lines) $289\_1_A$ and $289\_3_A$ associated transistors 288.

Figure 5B:
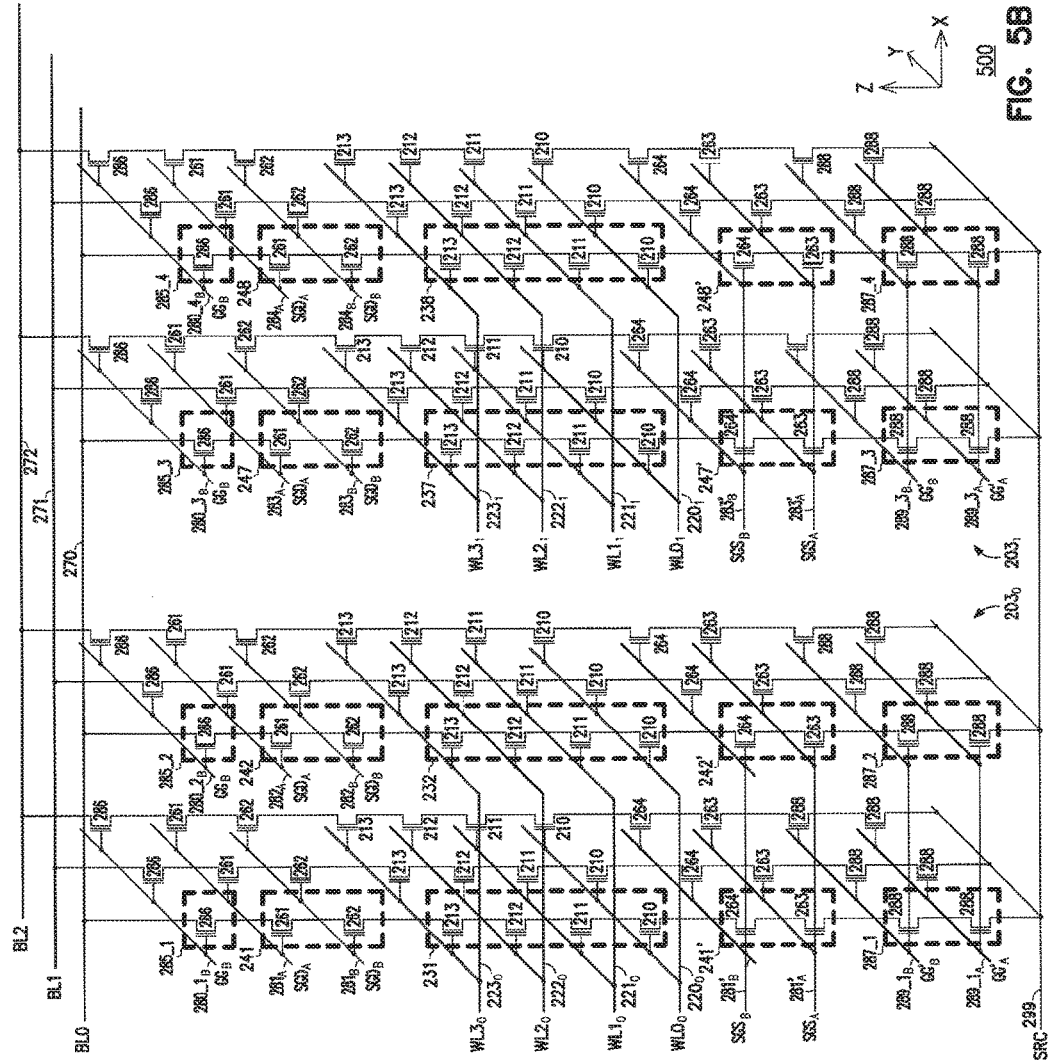
FIG. 5B shows a schematic diagram of the memory device of FIG. 5A, according to some embodiments described herein.

FIG. 5B shows schematic diagram of memory device 500 of FIG. 5A, according to some embodiments described herein. Memory device 500 includes elements similar to or identical to those of memory device 200 of FIG. 2B. As shown in FIG. 5B, each of circuits (top GILD current generator circuits) 285_1, 285_2, 285_3, and 285_4 can include one of transistors 286. For simplicity, fewer than all of circuits 285_1, 285_2, 285_3, 285_4 are labeled in FIG. 5B. Each of circuits (bottom GILD current generator circuits) 287_1, 287_2, 287_3, and 287_4 can include two of transistors 288. For simplicity, fewer than all of circuits 287_1, 287_2, 287_3, and 287_4 are labeled in FIG. 5B. Lines $289\_1_A$ and $289\_3_A$ can be coupled to the gates of respective transistors among transistors 288.

Figure 5C:
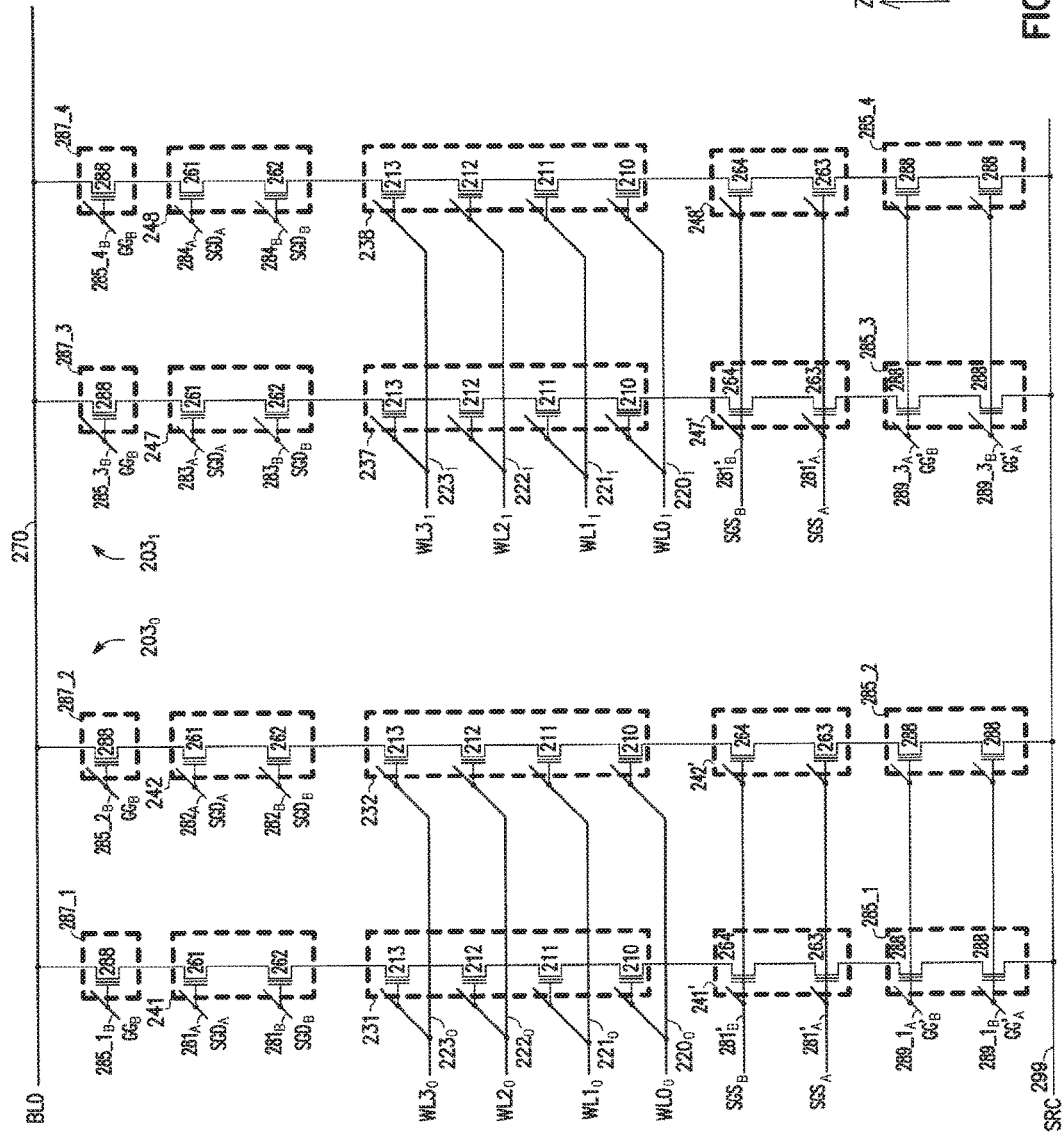
FIG. 5C shows a schematic diagram of a portion of the memory device of FIG. 5B, according to some embodiments described herein.

FIG. 5C shows a schematic diagram of a portion of memory device 500 of FIG. 5B including line 270, circuits 285_1, 285_2, 285_3, 285_4, select circuits 241, 242, 247, and 248, memory cell strings 231, 232, 237, and 238, select circuits 241', 242', 247', and 248', circuits 287_1, 287_2, 287_3, and 287_4, and line 299, according to some embodiments described herein. As shown in FIG. 5C, select gates 263 and 264 of each of select circuits 241', 242', 247', and 248' can be coupled in series with two transistors among transistors 288 between line 299 and a respective memory cell string among memory cell strings 231, 232, 237, and 238.

Figure 5D:
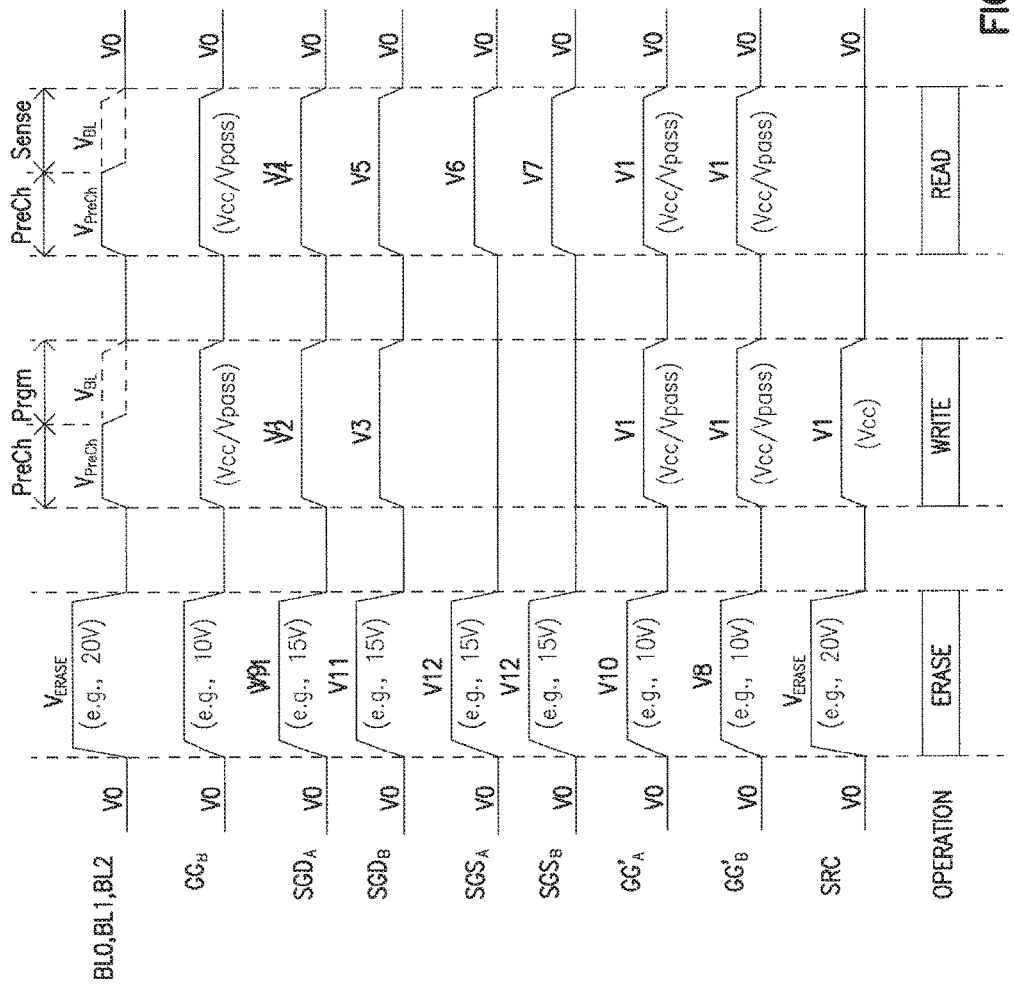
FIG. 5D shows example waveforms of some of the signals of the memory device of FIG. 5A through FIG. 5C during example erase, write, and read operations, according to some embodiments described herein.

FIG. 5D shows example waveforms of signals BL0, BL1, BL2, GG, $SGD_A$, $SGD_B$, $SGS_A$, $SGS_B$, $GG'_A$, and $GG'_B$, and SRC of memory device 500 (FIG. 5A through FIG. 5C) during example erase, write, and read operations, according to some embodiments described herein. FIG. 5D omits other signals of memory device 500 (e.g., signals shown in FIG. 5C) to help focus on the embodiments of the memory device described herein. During erase, write, and read operations, the omitted signals can be provided with voltages having values known to those skilled in the art.

The waveforms of FIG. 5D are similar to the waveforms of FIG. 2D except for the omission of signal $GG_A$ and for addition of signal $GG'_A$. As shown in FIG. 5D, the waveforms of signal $GG'_A$ can be the same as the waveforms of signal $GG_A$ (FIG. 2D). During the erase operation of memory device 500, transistors 286 and 288 in respective circuits 285_1, 285_2, 285_3, 285_4, 287_1, 287_2, 287_3, and 287_4 can operate to generate GIDL current to help the erase operation. For example, the GIDL current generated by transistors 286 and 288 during the erase operation may speed up the charging of the body of the memory cell strings in the selected block in preparation for information in memory cells of the memory cell strings of the selected block to be erased.

Figure 6:
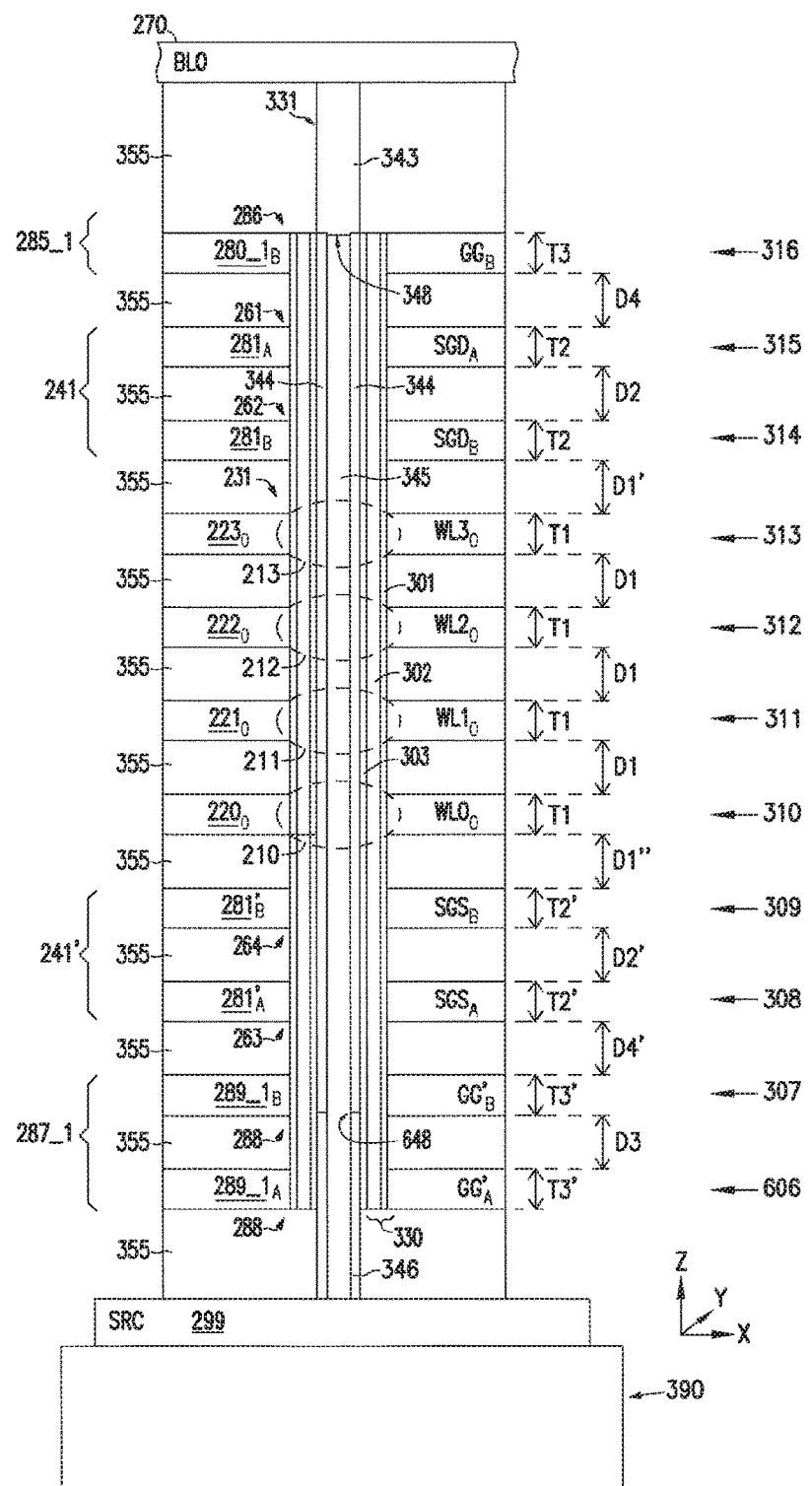
FIG. 6 shows a side view of a structure of a portion of the memory device of FIG. 5A through FIG. 5C, according to some embodiments described herein.

FIG. 6 shows a side view of a structure of a portion of memory device 500, according to some embodiments described herein. The structure of memory device 500 in FIG. 6 corresponds to part of the schematic diagram of memory device 500 shown in FIG. 5C. The portion of memory device 500 shown in FIG. 6 includes elements similar to or identical to those of memory device 200 of FIG. 3. Differences between memory device 200 (FIG. 3) and memory device 500 (FIG. 6) include the omission of line 280_$1_A$ and an associated transistor 286 in circuit 285_$1_A$ and the addition of line 289_$1_A$ and an associated transistor 288 in circuit 287_1. As shown in FIG. 6, transistor 288 associated with line (e.g., transistor gate line) 289_$1_A$ can be located in level 606 along a segment (segment at level 606) of pillar 331. Line 289_$1_A$ can also be located in level 606 along a segment (segment at level 606) of pillar 331.

As shown in FIG. 6, memory device 500 includes an interface 648 in pillar 331. Interface 648 is the location where portion 346 (e.g., the material of portion 346 (e.g., an n-type doped region that forms portion 346)) contacts portion 344 (e.g., contacts the material of portion 344). FIG. 6 shows an example where interface 648 is located (e.g., positioned) at approximately level 606. However, interface 648 can be located (e.g., positioned) at another location in pillar 331 (e.g., at a location between levels 307 and 606). As described below with reference to FIG. 7, the structure of memory device 500 can allow its operations (e.g., erase operation) it to be less susceptible to process variations (process of forming memory device 500). This allows memory device 500 to maintain its operations even if the location of interface 648 may deviate from its intended location (e.g., due to process variations).

Figure 7:
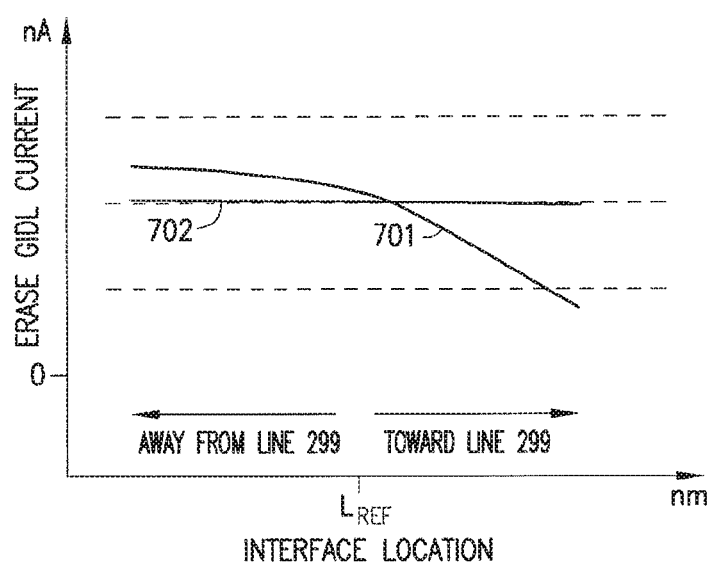
FIG. 7 is a graph showing an example relationship between the location of an interface in a pillar of the memory device of FIG. 6 and erase GIDL current generated during an erase operation and of the memory device, according to some embodiments described herein.

FIG. 7 is a graph showing an example relationship between the location (e.g., position) of interface 648 and erase GIDL current generated during an erase operation of memory device 500 of FIG. 6, according to some embodiments described herein. The following description refers to FIG. 6 and FIG. 7. In FIG. 7, a reference location $L_{REF}$ can represent an intended (e.g., desired) location for interface 648 at which erase GIDL current is expected (e.g., based on design simulation) to be at an intended amount (e.g., a desired amount) for an erase operation of memory device 500. As an example, reference location $L_{REF}$ of interface 648 can be the location in pillar 331 at level 606 as shown in FIG. 6.

In FIG. 7, the arrow showing a direction "away from line 299" indicates that the location of interface 648 in memory device 500 may deviate (e.g., due to process variations) from reference location $L_{REF}$ (e.g., an intended location) in a direction away from line 299. This means that the length of portion 346 in the z-dimension (after memory device 500 is formed) would be greater than the intended length of portion 346 if interface 648 moves (e.g., shifts) from reference location $L_{REF}$ in a direction way from line 299. The length of portion 346 can be the length of a diffusion region (e.g., an n-type doped region) that forms portion 346. The intended length of portion 346 can be measured from line 299 to the location of interface 648 at reference location $L_{REF}$ (e.g., an intended location).

In FIG. 7, the arrow showing a direction "toward line 299" indicates that the location of interface 648 in memory device 500 may deviate (e.g., due to process variations) from reference location $L_{REF}$ (e.g., an intended location) in a direction toward line 299. This means that the length of portion 346 in the z-dimension (after memory device 200 is formed) would be less than the intended length of portion 346 if interface 648 moves (e.g., shifts) from reference location $L_{REF}$ in a direction toward line 299.

In FIG. 7, curves 701 and 702 represent two example situations showing the effect of deviation (e.g., due to process variations) in the location of interface 648 on the amount of erase GIDL current in memory device 500. Curve 701 shows a situation where line 289_$1_A$ and transistor 288 (FIG. 6) are removed from memory device 500 (e.g., memory device 500 without line 289_$1_A$ and transistor 288). Curve 702 shows a situation where line 289_$1_A$ and transistor 288 are included in memory device 500 as shown in FIG. 5A through FIG. 6.

As shown by curve 701 (without line 289_$1_A$ and transistor 288 in memory device 500), the amount of erase GIDL current is lower if the location of interface 648 varies and moves from reference location $L_{REF}$ toward line 299 (moves closer to line 299). A lower amount of erase GIDL may degrade the erase operations of memory device 500.

In contrast, as shown by curve 702 (with line 289_$1_A$ and transistor 288 in memory device 500), the amount of erase GIDL current can remain relatively unchanged (e.g., remain stable) if the location of interface 648 varies and moves from reference location $L_{REF}$ in a direction either away from (farther from) line 299 or toward (closer to) line 299.

In sum, the inclusion of line 289_$1_A$ and transistor 288 in memory device 500 allows the amount of erase GIDL current to remain relatively unchanged in memory device 500. Thus, the operations (e.g., erase operations) of memory device 500 can be less susceptible to variations in the location of interface 648. This can improve the reliability of memory device 500.

Figure 8A:
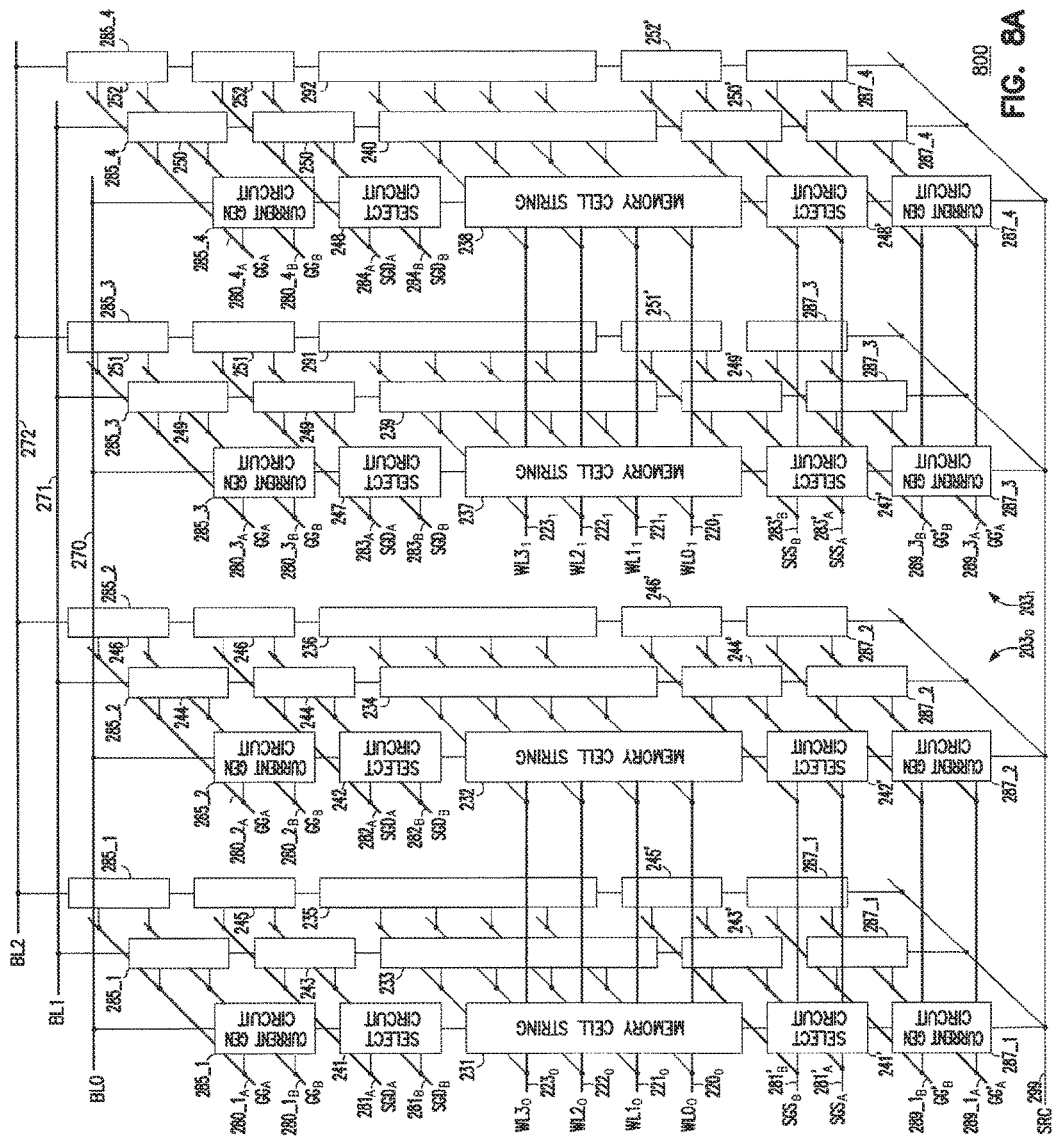
FIG. 8A shows a block diagram of a portion of a memory device, which can be a variation of the memory device of FIG. 2A and the memory device of FIG. 5A, according to some embodiments described herein.

FIG. 8A shows a block diagram of a portion of a memory device 800, which can be a variation of memory device 200 of FIG. 2A and memory device 500 of FIG. 5A, according to some embodiments described herein. Memory device 800 includes elements similar to or identical to those of memory devices 200 and 500. For simplicity, the description of similar or identical elements between memory devices 800 and memory devices 200 and 500 is not repeated.

Memory device 800 can include a combination of memory devices 200 and 500. For example, circuits (e.g., top GIDL current generator circuits) 285_1, 285_2, 285_3, and 285_4 of memory device 800 can be the same as those of memory device 200 (FIG. 2A), and circuits (e.g., bottom GIDL current generator circuits) 287_1, 287_2, 287_3, and 287_4 of memory device 800 can be the same as those of memory device 500 (FIG. 5A).

Figure 8B:
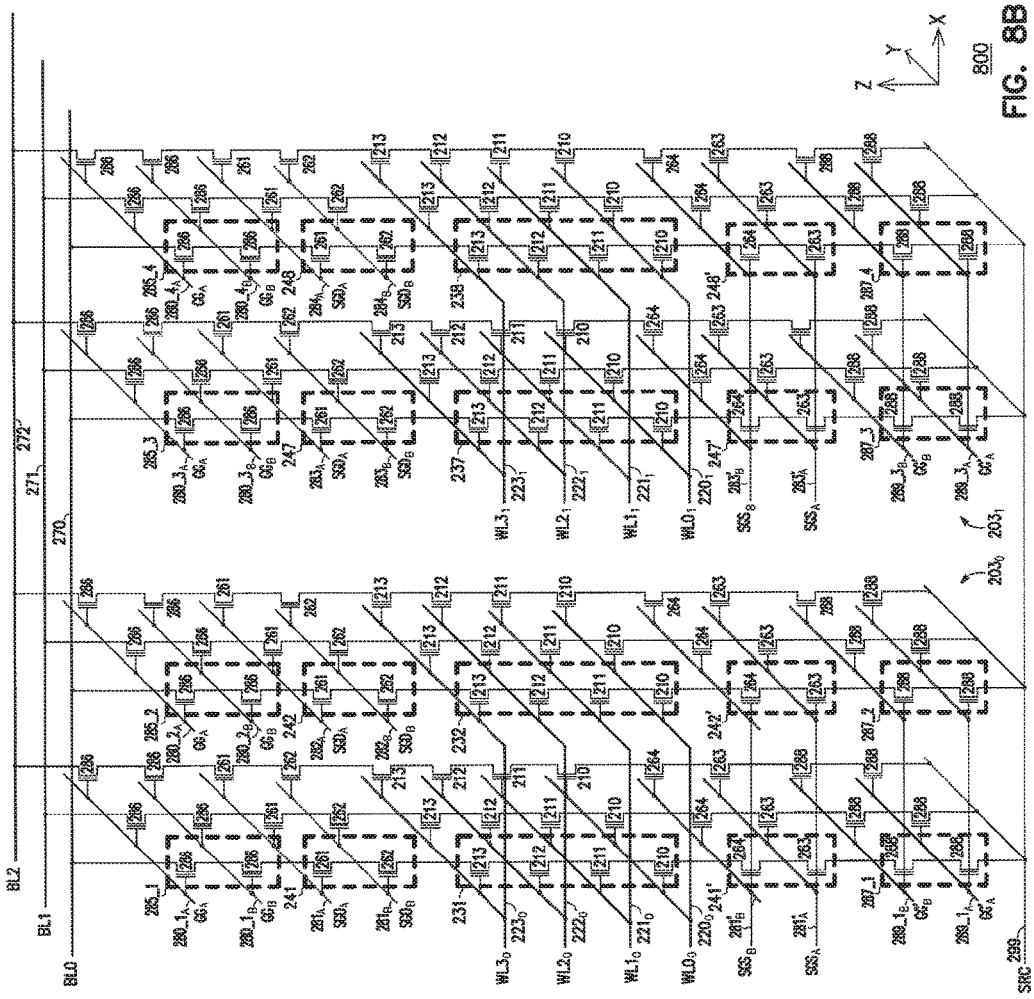
FIG. 8B shows a schematic diagram of the memory device of FIG. 8A, according to some embodiments described herein.

FIG. 8B shows a schematic diagram of memory device 800 of FIG. 8A, according to some embodiments described herein. Memory device 800 includes elements similar to or identical to those of memory device 200 of FIG. 2B and memory device 500 of FIG. 5B. As shown in FIG. 8B, each of circuits 285_1, 285_2, 285_3, and 285_4 can include two of transistors 286 (which are the same as those of memory device 200 of FIG. 2B), and each of circuits 287_1, 287_2, 287_3, and 287_4 can include two of transistors 288 (which are the same as those of memory device 500 of FIG. 5B).

Figure 8C:
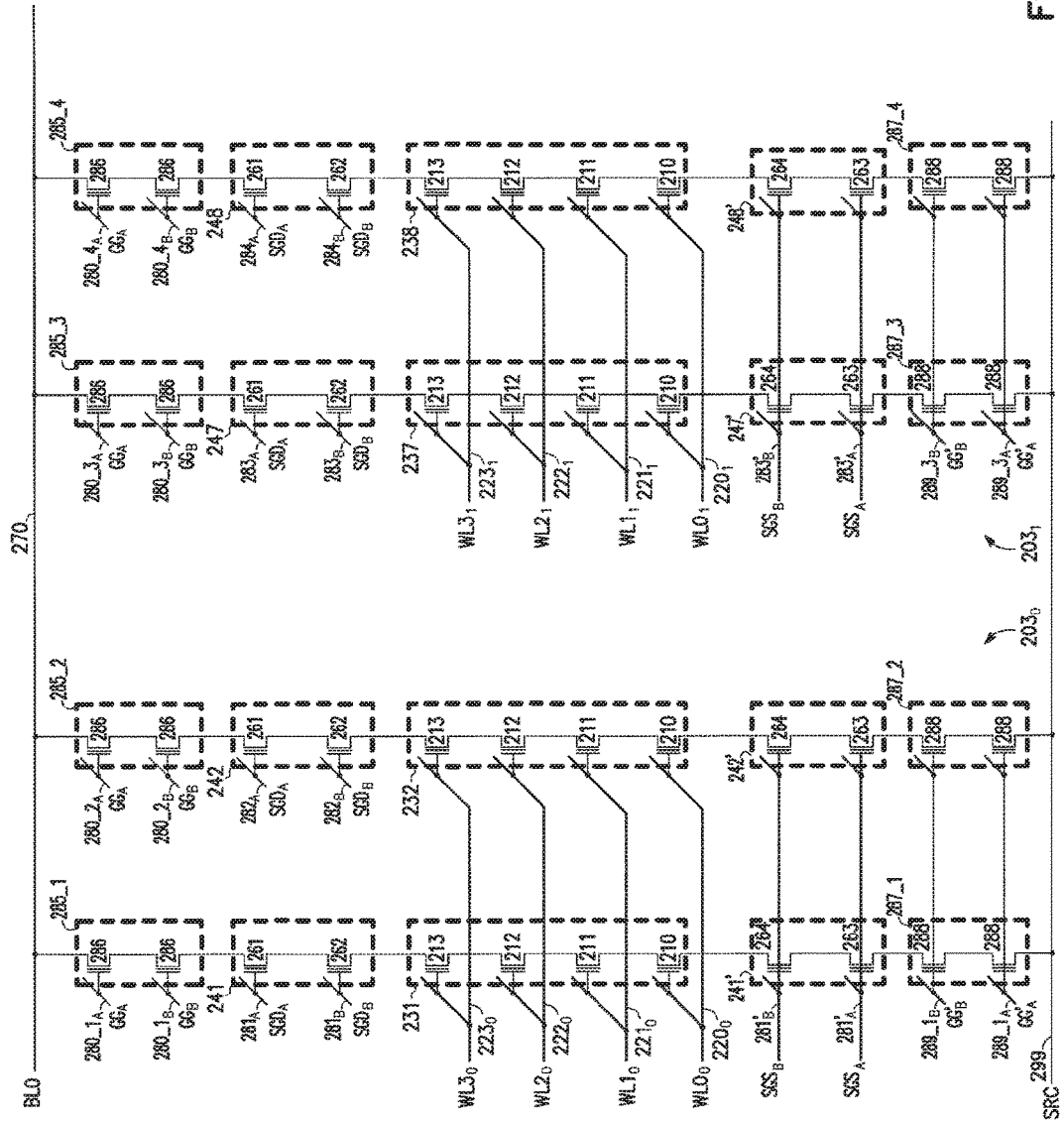
FIG. 8C shows a schematic diagram of a portion of the memory device of FIG. 8B, according to some embodiments described herein.

FIG. 8C shows a schematic diagram of a portion of memory device 800 of FIG. 8B including line 270, circuits 285_1, 285_2, 285_3, 285_4, select circuits 241, 242, 247, and 248, memory cell strings 231, 232, 237, and 238, select circuits 241', 242', 247', and 248', circuits 287_1, 287_2, 287_3, and 287_4, and line 299, according to some embodiments described herein.

FIG. 8D shows example waveforms of signals BL0, BL1, BL2, $GG_A$, $GG_B$, $SGD_A$, $SGD_B$, $SGS_A$, $SGS_B$, $GG'_A$, $GG'_B$, and SRC of memory device 800 (FIG. 8A through FIG. 8C) during example erase, write, and read operations, according to some embodiments described herein. FIG. 8D omits other signals of memory device 800 (e.g., signals shown in FIG. 8C) to help focus on the embodiments of the memory device described herein. During erase, write, and read operations, the omitted signals can be provided with voltages having values known to those skilled in the art. The waveforms of FIG. 8D are the same as the waveforms of portions of FIG. 2D and FIG. 5D. For example, the waveforms of signals $GG_A$ and $GG_B$ in FIG. 8D are the same as the waveforms of signals $GG_A$ and $GG_B$ of FIG. 2D. The waveforms of signals $GG'_A$ and $GG'_B$ in FIG. 8D are the same as the waveforms of signals $GG'_A$ and $GG'_B$ of FIG. 5D.

Figure 9:
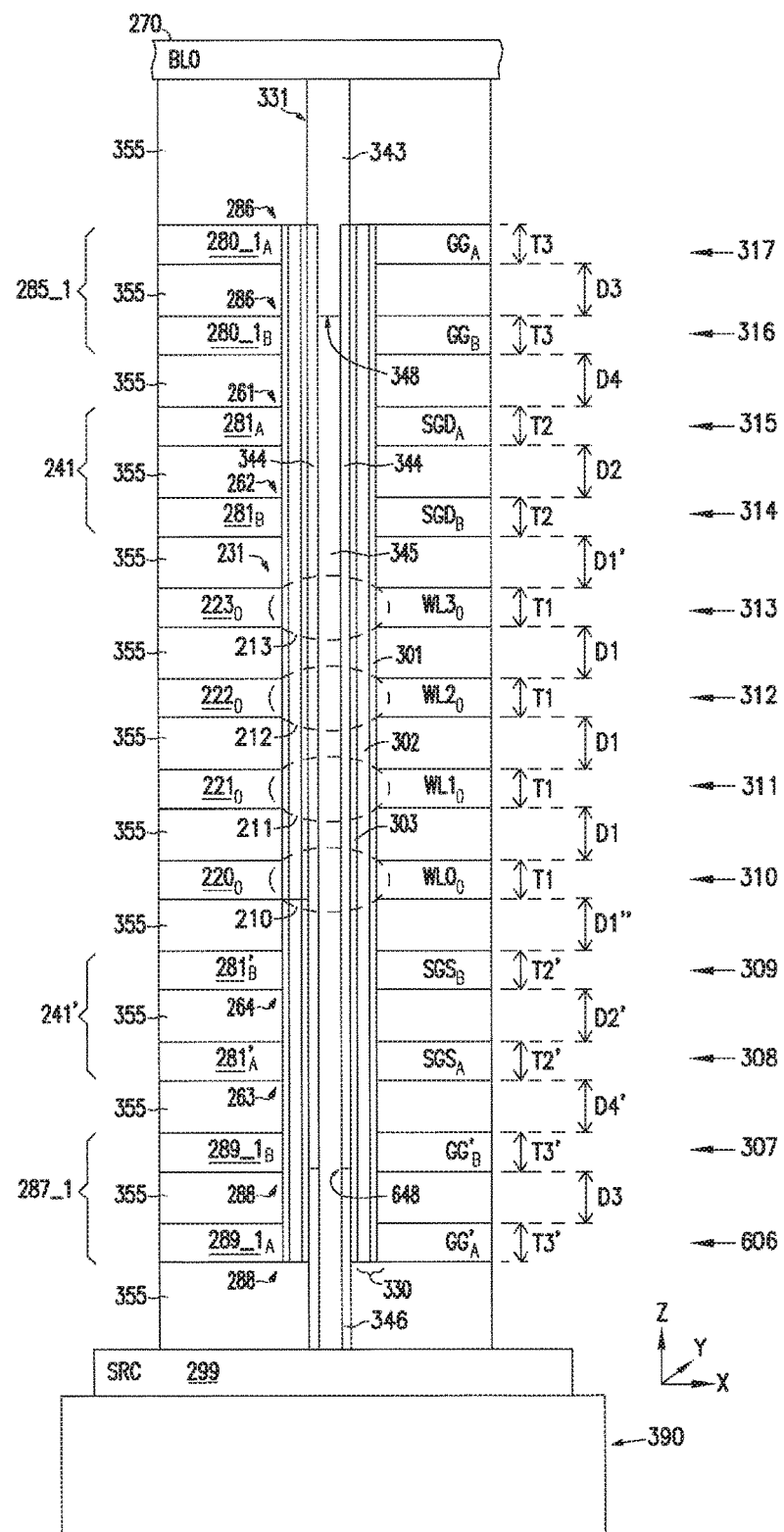
FIG. 9 shows a side view of a structure of a portion of the memory device of FIG. 8A through FIG. 8C, according to some embodiments described herein.

FIG. 9 shows a side view of a structure of a portion of memory device 800, according to some embodiments described herein. The structure of memory device 800 in FIG. 9 corresponds to part of the schematic diagram of memory device 800 shown in FIG. 8C. The portion of memory device 800 shown in FIG. 9 includes elements similar to or identical to those of memory device 200 of FIG. 3 and memory device 500 of FIG. 6. For example, as shown in FIG. 9, lines $280\_1_A$ and $280\_1_B$ and transistors 286 are the same as lines $280\_1_A$ and $280\_1_B$ and transistors 286 of FIG. 3, and lines $289\_1_A$ and $289\_1_B$ and transistors 288 in FIG. 9 are the same as lines $289\_1_A$ and $289\_1_B$ and transistors 288 of FIG. 6. Memory device 800 (FIG. 8A through FIG. 9) can have improvements similar to those of memory devices 200 and 500 described above with reference to FIG. 2A though FIG. 7.

Figure 10:
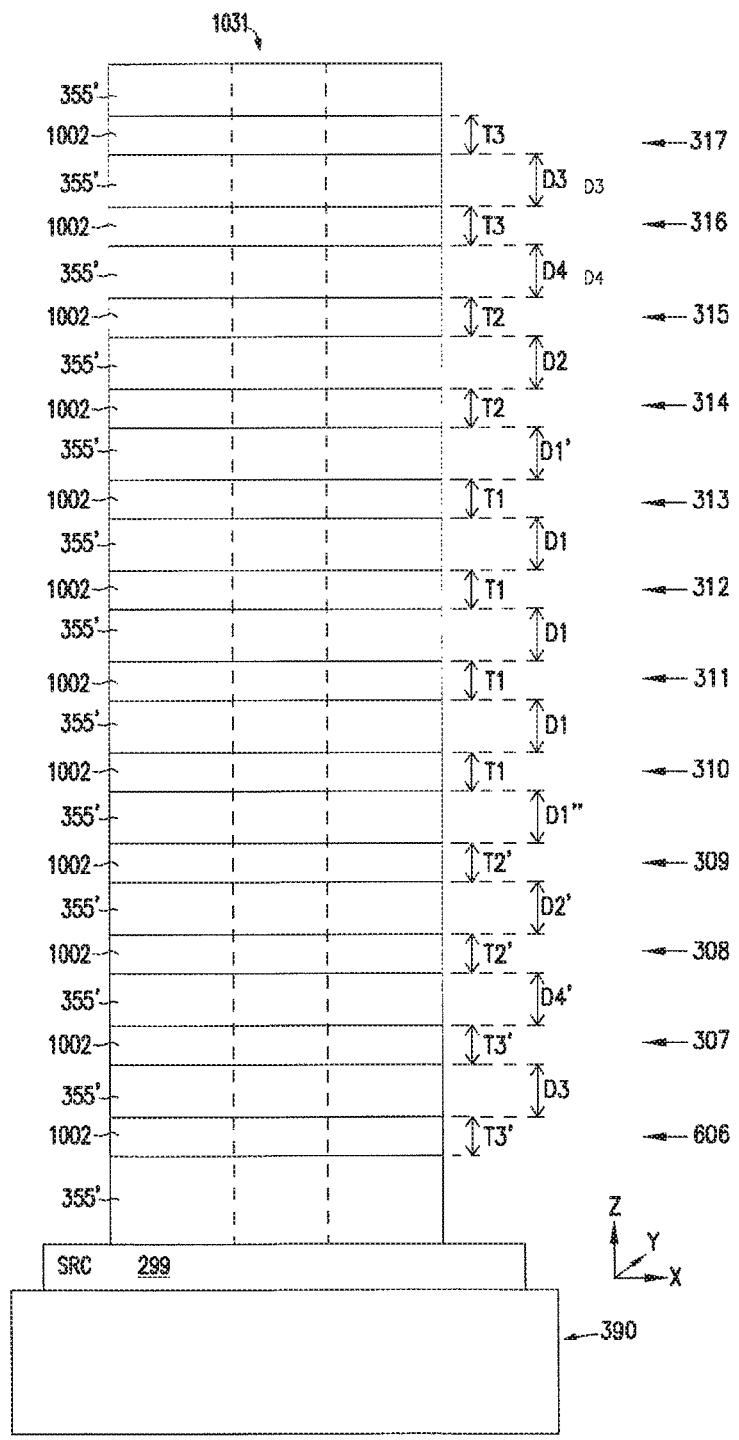
FIG. 10, FIG. 11, and FIG. 12 show sequential stages in example processes of forming a memory device, according some embodiments described herein.
Figure 11:
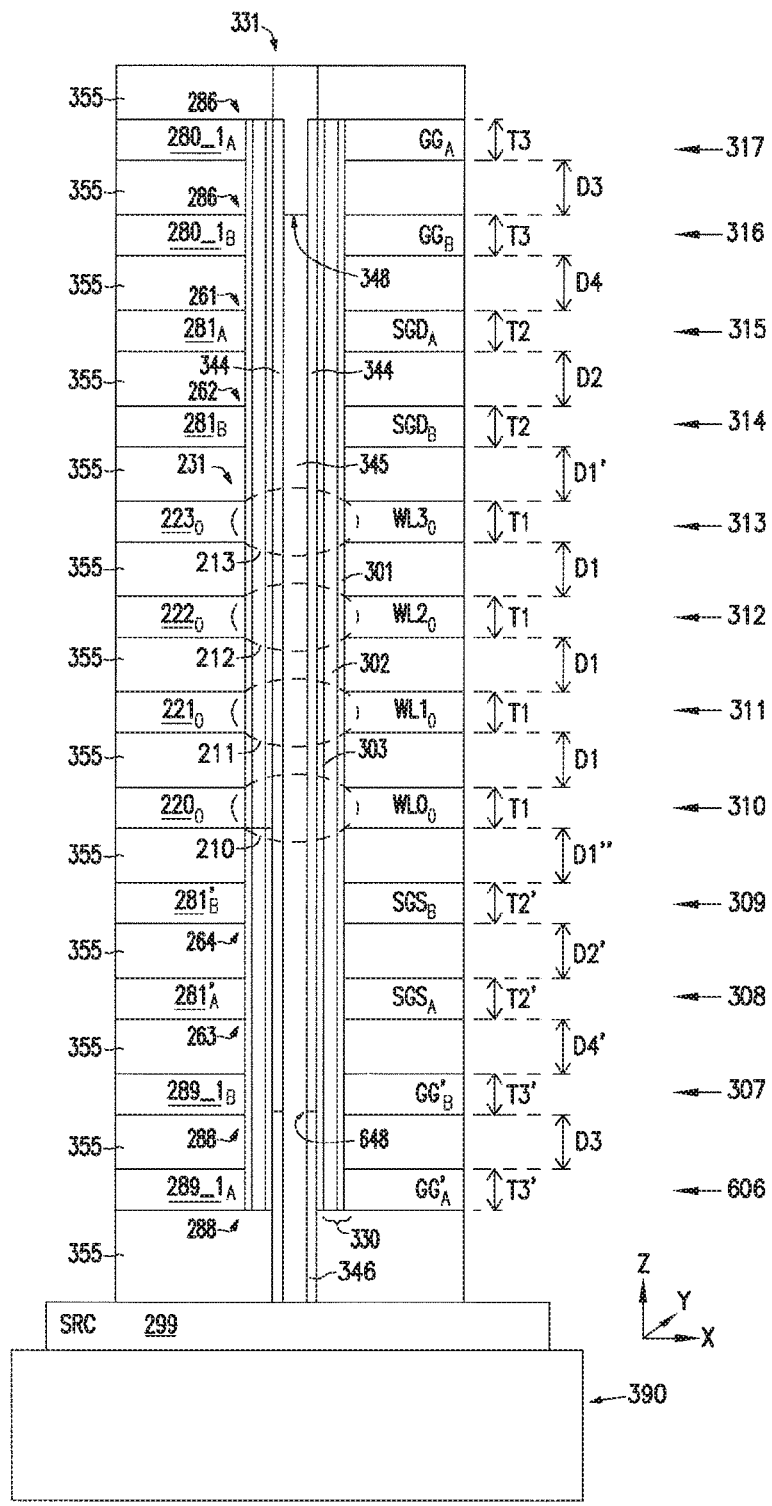
Figure 12:
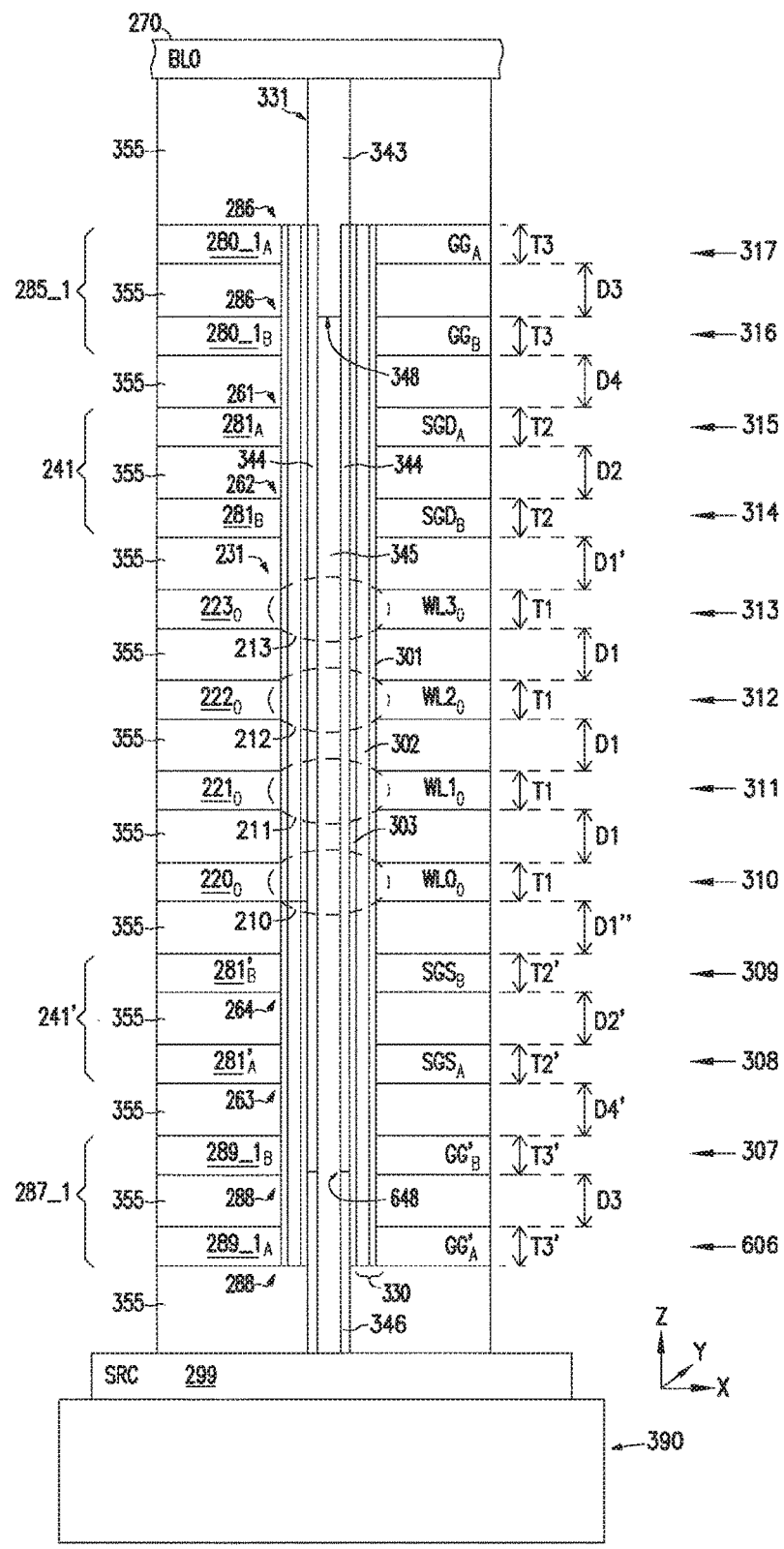

FIG. 10, FIG. 11, and FIG. 12 show sequential stages in example processes of forming a memory device 1000, according to some embodiments described herein. The processes described with reference to FIG. 10 through FIG. 12 can be used to form memory device 200 (FIG. 3), memory device 500 (FIG. 6), and memory device 800 (FIG. 9) described above with reference to FIG. 1 through FIG. 9. Some of the processes of forming memory device 1000 and some of the elements of memory device 1000 may be readily known to those skilled in the art. Thus, to help focus on the embodiments described herein, some of the processes of forming memory device 1000 shown FIG. 10 through FIG. 12 and additional processes to complete memory device 1000 are omitted. Further, for simplicity, similar or identical elements among the memory devices in FIG. 2A through FIG. 12 are given the same labels.

FIG. 10 shows memory device 1000 after materials 355' and 1002 are formed over line (e.g., source) 299 and substrate 390. Forming materials 355' and 1002 can include depositing alternating dielectric materials (e.g., alternating layers of materials 355' and layers of materials 1002) over line 299 and substrate 390. Materials 355' can include an oxide of silicon (e.g., silicon dioxide $SiO_2$). Materials 1002 can include a combination of silicon and nitrogen (e.g., silicon nitride $SiNO_4$). Materials 1002 can be formed in each of levels 606 and 307 through 317 of memory device 1000 (e.g., each layer of materials 1002 can be formed in a respective level among levels 606 and 307 through 317).

As shown in FIG. 10, materials 355' can be formed to have respective thicknesses that are defined by (e.g., equal to) respective distances (vertical distances) D1, D1', D1", D2, D2', D3, D4, and D4'. Distances D1, D1', D1", D2, D2', D3, D4, and D4' are the same as those of FIG. 3, FIG. 6, and FIG. 9. As described above with reference to FIG. 3, FIG. 6, and FIG. 8, distances D1, D1', D1", D2, D2', D3, D4, and D4' can be the same (e.g., substantially equal). Thus, in FIG. 10, the thicknesses of materials 355' can be the same (e.g., substantially equal).

Materials 1002 can be formed to have respective thicknesses T1, T2, T2', T3, and T3', which can be same (e.g., substantially equal). Thicknesses T1, T2, T2', T3, and T3' are the same as those shown in FIG. 3, FIG. 6, and FIG. 9. In FIG. 10, a location 1031 (between two dashed lines) indicates a location at which portions of materials 335' and 1002 will be removed to form a hole in materials 335' and 1002 (described below).

FIG. 11 shows memory device 1000 after some elements of memory device 1000 are formed. Such memory elements include a portion of pillar 331, memory cell string 231, control lines $220_0$, $221_0$, $222_0$, and $223_0$, lines (e.g., transistor gate lines) $280\_1_A$ and $280\_1_B$, select lines $281_A$ and $281_B$, $281'_A$, and $281'_B$, and lines (e.g., transistor gate lines) $289\_1_A$ and $289\_1_B$, structure 330, and other elements (as shown in FIG. 11) that can be similar to those of memory device 200 (FIG. 3), memory device 500 (FIG. 6), and memory device 800 (FIG. 9).

Forming the elements of memory device 1000 in FIG. 11 can include using a process such as a damascene process or other processes. For example, after the materials 355' and 1002 (FIG. 10) are formed, a hole (a vertical opening, not shown in FIG. 11) can be formed in materials 355' and 1002 at location 1031 (FIG. 10). The hole can be formed by removing (e.g., by etching) parts of materials 355' and 1002 at the location 1031 (FIG. 10) and leaving a remaining part of materials 355' (which are the materials of dielectrics 355 in FIG. 11 where the hole was not formed) and leaving a remaining part of materials 1002 (not shown in FIG. 11) at respective levels 606 and 307 through 317. The bottom of the hole can be at line 299 (e.g., at a top surface of line 299). After the hole is formed, as shown in FIG. 11, memory cell string 231 (including structure 330) can be formed at the location of the hole. Other structures (e.g., portions 344, 345, 346, and parts of portions 343 of pillar 331) of memory device 1000 can also be formed at the location of the hole.

After the portions of pillar 331 and structure 330 are formed, the remaining part of materials 1002 (where the hole was not formed) can be removed (e.g., by etching). Removing materials 1002 can include forming slits (e.g., not shown in FIG. 11) in the remaining part of materials 355' and in the remaining part of materials 1002. Such slits (e.g., vertical openings) can be part of a damascene process used to form memory device 1000. After the slits are formed, material 1002 can be subsequently etched away through the slits, thereby leaving vacancies (e.g., spaces) at the locations on each of levels 606 and 307 through 317 where materials 1002 were (before their removal). Since the thicknesses of materials 1002 (FIG. 10) can be the same (as discussed above), the spaces where materials 1002 were removed can also have the same thickness (e.g., same vertical distance).

After the removal of materials 1002, conductive material (e.g., metal such as tungsten or other conductive materials) may be formed (e.g., filled) in the vacancies (e.g., the spaces on each of levels 606 and 307 through 317) where materials 1002 were removed. As shown in FIG. 11, the conductive materials on levels 606 and 307 through 317 form the respective lines (e.g., transistor gate lines) $280\_1_A$ and $280\_1_B$, select lines $281_A$ and $281a$, control lines $220_0$, $221_0$, $222_0$, and $223_0$, select lines $281'_A$ and $281'$, and lines (e.g., transistor gate lines) $289\_1_A$ and $289\_1_B$ of memory device 1000.

Thus, as described above, lines $280\_1_A$ and $280\_1_B$, select lines $281_A$ and $281_B$, control lines $220_0$, $221_0$, $222_0$, and $223_0$, select lines $281'_A$ and $281'_B$, and lines $289\_1_A$ and $289\_1_B$ of memory device 1000 can be formed concurrently (formed by the same process step (e.g., the same deposition step)). Further, lines $280\_1_A$ and $280\_1_B$, select lines $281_A$ and $281_B$, control lines $220_0$, $221_0$, $222_0$, and $223_0$, select lines $281'_A$ and $281'_B$, and lines $289\_1_A$ and $289\_1_B$ can also be formed from the same conductive material (e.g., metal or other conductive materials).

FIG. 12 shows memory device 1000 after other elements of memory device 1000 are formed. Such elements include additional conductive materials at portions 343 to complete pillar 331, and other portions (e.g., line 270) of memory device 1000.

As shown in FIG. 12, memory device 1000 can include elements that are similar to or identical to the elements of memory device 800 of FIG. 9. Thus, the processes of forming a memory device 1000 can be used to form memory device 800 of FIG. 9. One skilled in the art would readily recognize that processes similar to the processes of forming a memory device 1000 described above with reference to FIG. 10 through FIG. 12 can also be used to form memory device 200 (FIG. 6) and memory device 800 (FIG. 9).

The illustrations of apparatuses (e.g., memory devices 100, 200, 500, 800, and 1000) and methods (e.g., operating methods associated with memory devices 100, 200, 500, and 800, and methods (e.g., processes) of forming these memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 500, 800, and 1000) or a system (e.g., a computer, a cellular phone, or other electronic system) that includes a device such as any of memory devices 100, 200, 500, 800, and 1000.

Any of the components described above with reference to FIG. 1 through FIG. 12 can be implemented in a number of ways, including simulation via software. Thus, apparatuses (e.g., memory devices 100, 200, 500, 800, and 1000 or part of each of these memory devices, including a control unit in these memory devices, such as control unit 116 (FIG. 1)) described above, may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 500, 800, and 1000 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 12 include apparatuses and methods of using and forming such apparatuses. An apparatus among the apparatuses includes first and second conductive materials located in respective first and second levels of the apparatus, a pillar including a length extending between the first and second conductive materials, memory cells and control lines located along the pillar, a first select gate and a first select line located along the pillar between the first conductive material and the memory cells, a second select gate and a second select line located along the pillar between the first conductive material and the first select line, a first transistor and a first transistor gate line located along the pillar between the first conductive material and the first select line, and a second transistor and a second transistor gate line located along the pillar between the first conductive material and the first transistor. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
  a substrate;
  a conductive material located over the substrate;
  a pillar contacting the conductive material and having a length extending between the first conductive material and the substrate;
  memory cells and control lines located along the pillar and between the conductive material and the substrate;
  a first select gate and a first select line located along the pillar and between the conductive material and the memory cells;
  a second select gate and a second select line located along the pillar and between the first conductive material and the first select line;
  a first additional conductive material located along the pillar and between the conductive material and the second select line; and
  a second additional conductive material located along the pillar and between the conductive material and the first additional conductive material, wherein the pillar includes a conductive portion and a dielectric portion, the conductive portion contacts the dielectric portion at an interface, and the interface is located at a level between levels of the first select line and the second additional conductive material.

2. The apparatus of claim 1, further comprising a data line, wherein the conductive material is part of the data.

3. The apparatus of claim 1, wherein the conductive portion of the pillar includes polycrystalline silicon.

4. The apparatus of claim 1, wherein the conductive portion of the pillar includes n-type material.

5. The apparatus of claim 1, wherein each of the memory cells includes a structure configured to store information, and the structure is polycrystalline silicon structure.

6. The apparatus of claim 1, wherein each of the memory cells includes a structure configured to store information and the structure is a dielectric structure.

7. The apparatus of claim 1, wherein the memory cells, and the first and second select gates have a same structure.

8. The apparatus of claim 1, wherein the control lines and the first and d select lines are separated from a conductive channel of the pillar by a same distance.

9. The apparatus of claim 1, wherein the control lines, the first and second select lines, and first and second additional conductive materials include a same material.

10. The apparatus of claim 1, wherein a material of each of the control lines is metal.

11. An apparatus comprising.
a substrate;
a conductive material located over the substrate;
a pillar contacting the conductive material;
memory cells and control lines located along the pillar, the conductive material located between the memory cells and the substrate;
a first select gate and a first select line located along the pillar and between the memory cells and the conductive material;
a second select gate and a second select line located along the pillar and between the first select line and the conductive material;
a first additional conductive material located along the pillar and between the second select line and the conductive material; and
a second additional material located along the pillar and between the first additional conductive material and the conductive material, wherein the pillar includes a first conductive portion and a second conductive portion, the first conductive portion contacts the second conductive portion at an interface, and the interface is located at a level between levels of the first select line and the second additional conductive material.

12. The apparatus of claim 11, further comprising a source line, wherein the conductive material is part of the source.

13. The apparatus of claim 11, wherein at least one of the first and second the conductive portions of the pillar includes polycrystalline silicon.

14. The apparatus of claim 11, wherein each of the memory cells includes a structure configured to store information, and the structure is polycrystalline silicon structure.

15. The apparatus of claim 11, wherein each of the memory cells includes a structure configured to store information, and the structure is a dielectric structure.

16. An apparatus comprising:
a first conductive material located in a first level of the apparatus;
a second conductive material located in a second level of the apparatus;
a pillar including a length extending between the first and second levels and contacting the first and second conductive materials;
memory cells and control lines located along the pillar and between the first and second conductive materials;
a first select gate and a first select line located along the pillar between the first conductive material and the memory cells;
a second select gate and a second select line located along the pillar and between the first conductive material and the first select line:
a first additional conductive material located along the pillar and between the first conductive material and the second select line;
a second additional conductive material located along the pillar and between the first conductive material and the first additional conductive material, wherein the pillar includes a conductive portion and a dielectric portion, the conductive portion contacts the dielectric portion at a first interface, and the first interface is located at a level between levels of the first select line and the second additional conductive material;
a third select gate and a third select line located along the pillar and between the memory cells and the second conductive material;
a fourth select gate and a fourth select line located along the pillar and between the third line and the second conductive material;
a third additional conductive material located along the pillar and between the fourth select line and the second conductive material; and
a fourth additional material located along the pillar and between the third additional conductive material and the second conductive material, wherein the pillar includes a first additional conductive portion and a second additional conductive portion, the first additional conductive portion contacts the second additional conductive portion at a second interface, and the second interface is located at a level between levels of the third select line and the fourth additional conductive material.

17. The apparatus of claim 16, further comprising a data line and a source, wherein the first conductive material is part of the data line, and the second conductive material is part of the source.

18. The apparatus of claim 16, wherein the first conductive portion of the pillar includes polycrystalline silicon.

19. The apparatus of claim 18, wherein the second conductive portion of the pillar includes polycrystalline silicon.

20. The apparatus of claim 16, wherein the control lines, the first, second, third, and fourth select lines, and the first, second, third, and fourth additional conductive materials are separated from a conductive channel of the pillar by a same distance.

* * * * *